United States Patent
Motoda et al.

[11] Patent Number: 5,872,022
[45] Date of Patent: Feb. 16, 1999

[54] METHOD FOR ETCHING A SEMICONDUCTOR METHOD FOR FABRICATING SEMICONDUCTOR DEVICE METHOD FOR FABRICATING SEMICONDUCTOR LASER AND SEMICONDUCTOR LASER

[75] Inventors: Takashi Motoda; Manabu Kato; Masayoshi Takemi, all of Itami, Japan

[73] Assignee: Mitsubishi Denki Kabushiki Kaisha, Tokyo, Japan

[21] Appl. No.: 522,933

[22] Filed: Sep. 1, 1995

[30] Foreign Application Priority Data

Sep. 2, 1994 [JP] Japan ................... 6-209980

[51] Int. Cl.$^6$ .................. H01L 21/00; H01L 21/302
[52] U.S. Cl. .................. 438/39; 438/47; 438/718
[58] Field of Search .................. 437/81, 105, 129; 156/643.1, 656.1; 438/39, 47, 718

[56] References Cited

U.S. PATENT DOCUMENTS

| | | | |
|---|---|---|---|
| 4,706,101 | 11/1987 | Nakamura et al. | 357/17 |
| 4,948,751 | 8/1990 | Okamoto et al. | 437/107 |
| 4,980,314 | 12/1990 | Strege | 437/129 |
| 5,266,518 | 11/1993 | Binsma et al. | 437/129 |
| 5,284,791 | 2/1994 | Sakata et al. | 437/129 |
| 5,316,967 | 5/1994 | Kaneno et al. | 437/105 |
| 5,468,343 | 11/1995 | Kitano | 156/656.1 |
| 5,541,950 | 7/1996 | Kizuki et al. | 372/46 |
| 5,556,804 | 9/1996 | Nagai | 437/129 |

FOREIGN PATENT DOCUMENTS

| | | |
|---|---|---|
| 61-280623 | 12/1986 | Japan . |
| 334534 | 2/1991 | Japan . |
| 03150294 | 6/1991 | Japan . |
| 4192413 | 7/1992 | Japan . |
| 5283393 | 10/1993 | Japan . |
| 2271466 | 4/1994 | United Kingdom . |

OTHER PUBLICATIONS

Chui et al, "Surface roughness during chemical beam etching and its remedy by enhanced cation diffusion", Appl. Phys. Lett., 65 (4), pp. 448–450, 1994.

Ghandhi, Sorab K., "VLSI Fabrication Principles Silicon and Gallium Arsenide", John Wiley and Sons, pp. 662–685, 1994.

Pak et al, "Vapor–Phase Etching Of InP Using Anhydrous HCl and $PH_3$ Gas", Journal of the Electrochemical Society, 1986, pp. 2204–2205 Month Unknown.

Caneau et al, "Etching Of InP By HCl In An OMVPE Reactor", Journal of Crystal Growth, vol. 107, 1991, pp. 203–208 Month Unknown.

Agnello et al, "In–Situ Etching Of InP By A Low Pressure Transient HCl Process", Journal of Crystal Growth, vol. 73, 1985, pp. 453–459 Month Unknown.

Epler et al., "In situ laser patterned desorption of GaAs quantum wells for monolithic multiple wavelength diode lasers", Applied Physics Letters, vol. 54, No. 18, Mar. 6, 1989, pp. 881–883.

Colas et al., "In situ Definition Of Semiconductor Structures By Selective Area Growth And Etching", Applied Physics Letters, vol. 59, No. 16, Oct. 1991, pp. 2019–2021.

*Primary Examiner*—John Niebling
*Assistant Examiner*—Michael S. Lebentritt
*Attorney, Agent, or Firm*—Leydig, Voit & Mayer, Ltd.

[57] ABSTRACT

A method of etching a III-V compound semiconductor uses an etching gas including the group V element of the III-V compound semiconductor substrate layer while keeping the III-V compound semiconductor layer at a temperature higher than the crystal growth temperature of the III-V compound semiconductor. Etching using this method provides a higher degree of controllability than wet etching. In addition, because no etching solution is employed, the etching method can be employed in a crystal growth apparatus. Further, because an element of the III-V compound semiconductor layer is employed in the etching gas, incorporation of residual impurities can be prevented, keeping the etched surface clean.

22 Claims, 28 Drawing Sheets

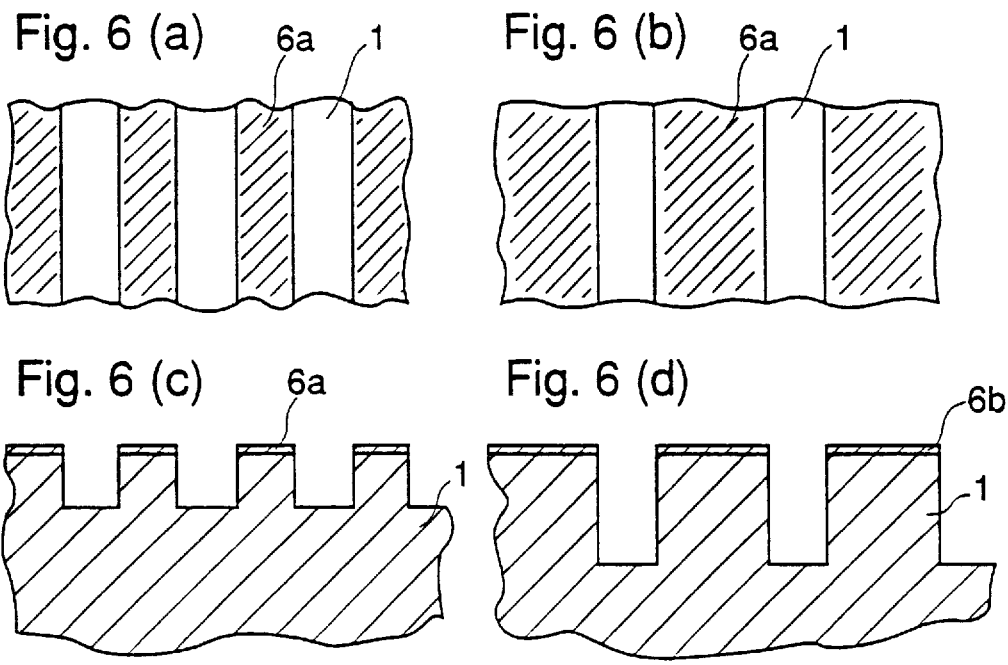
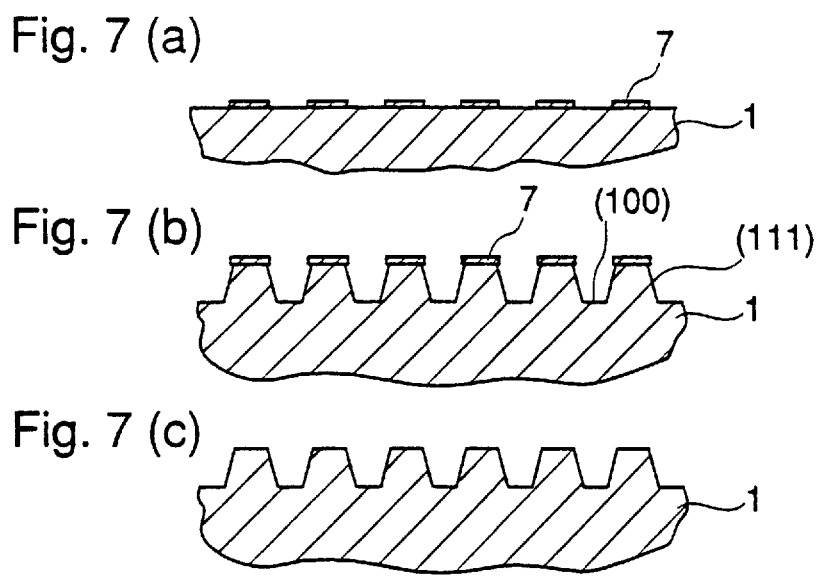

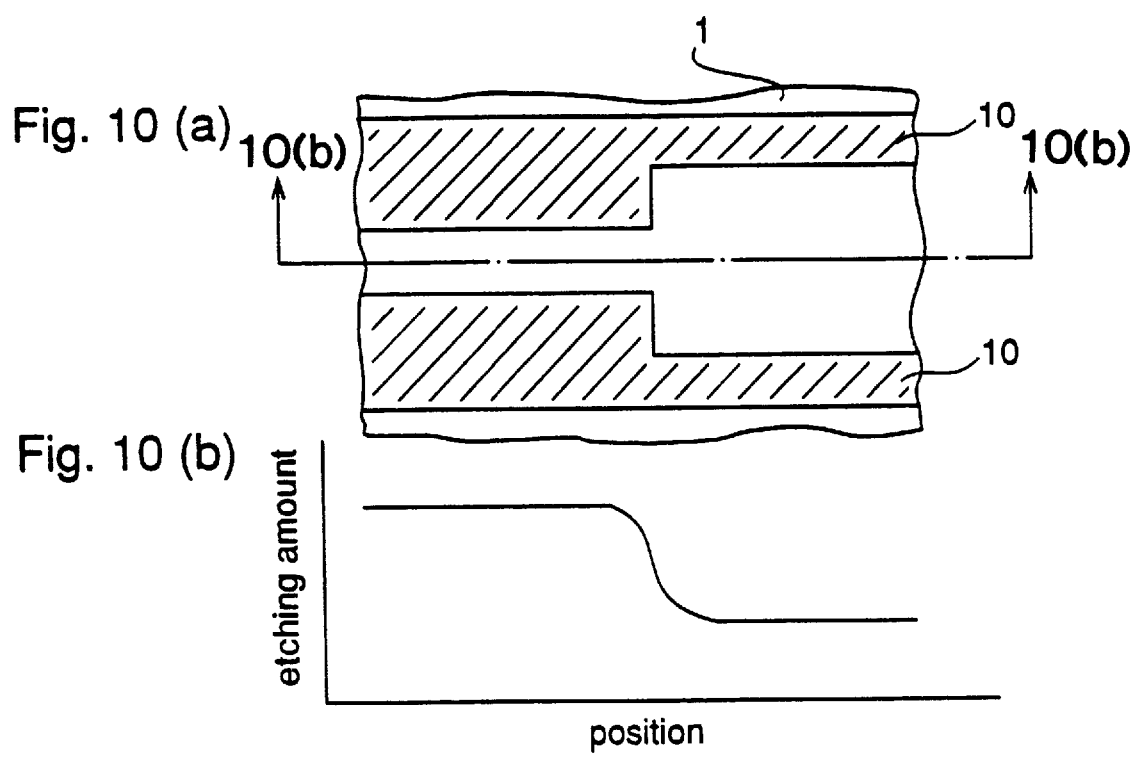
Fig. 10 (a)
Fig. 10 (b)
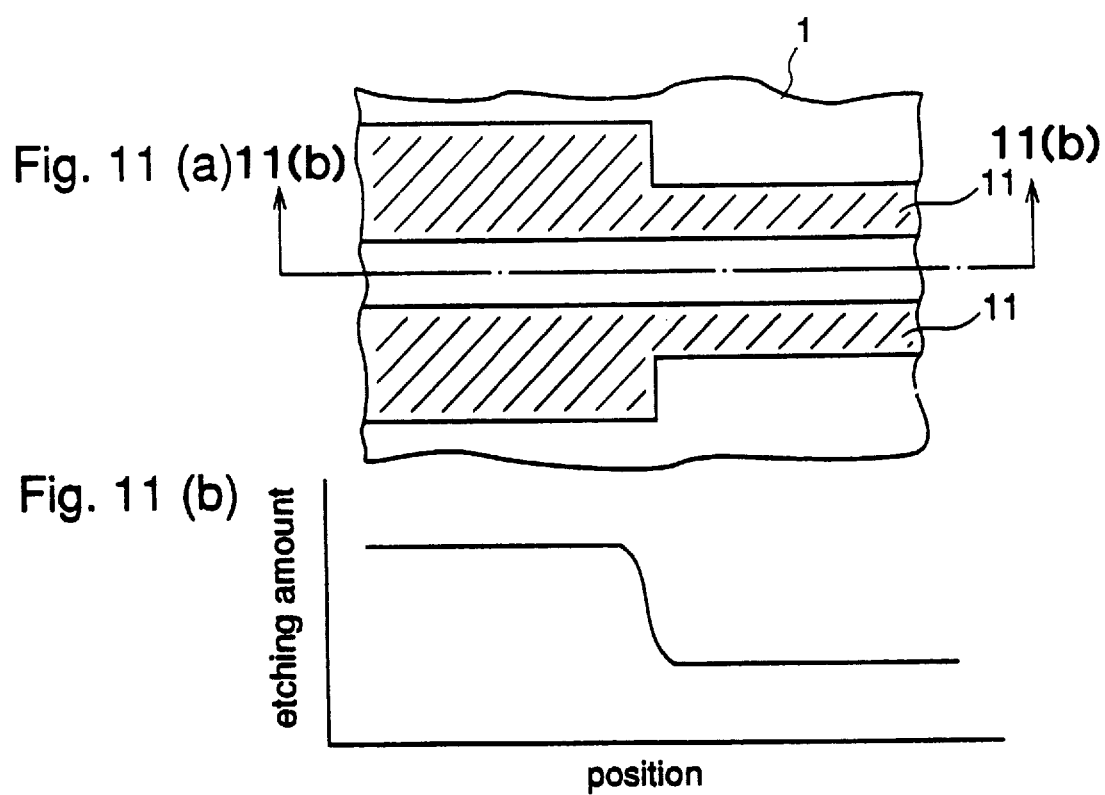
Fig. 11 (a)
Fig. 11 (b)

Fig. 14(g)
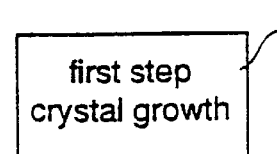
S1 first step crystal growth
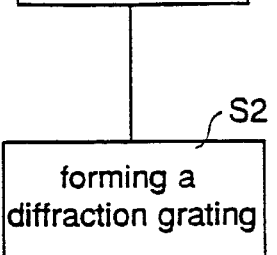
S2 forming a diffraction grating
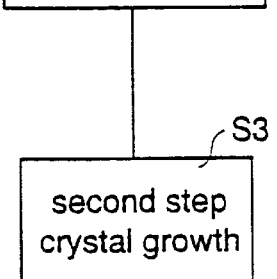
S3 second step crystal growth
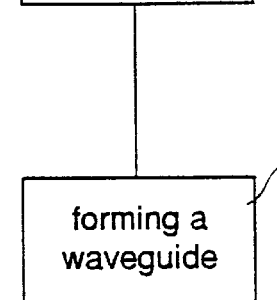
S4 forming a waveguide
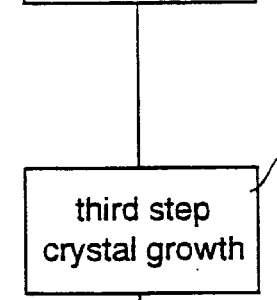
S5 third step crystal growth
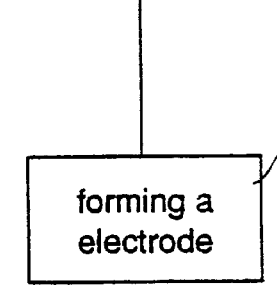
S6 forming a electrode
Fig. 14 (a)
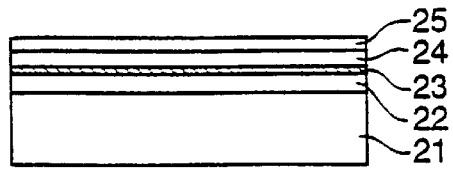
Fig. 14 (b)
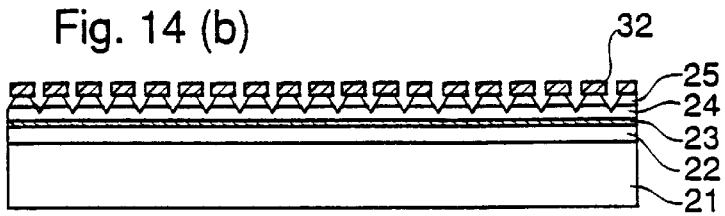
Fig. 14 (c)
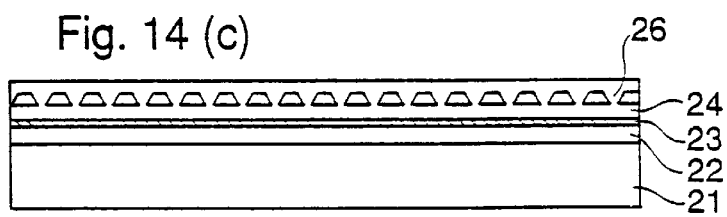
Fig. 14 (d)
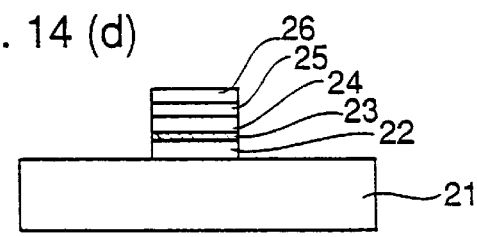
Fig. 14 (e)
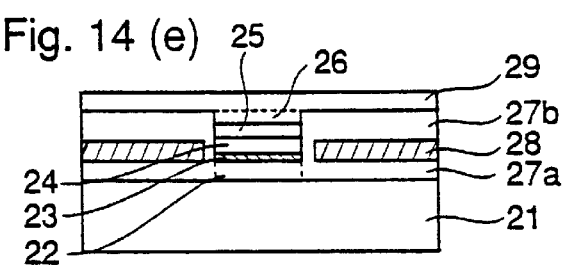
Fig. 14 (f)
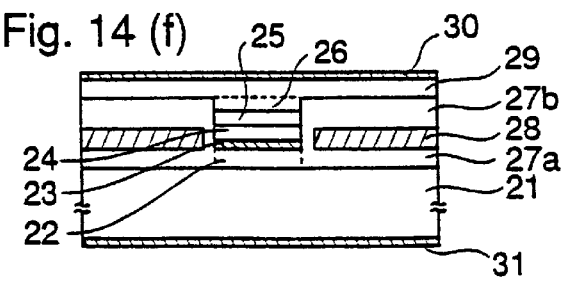

5,872,022

METHOD FOR ETCHING A SEMICONDUCTOR METHOD FOR FABRICATING SEMICONDUCTOR DEVICE METHOD FOR FABRICATING SEMICONDUCTOR LASER AND SEMICONDUCTOR LASER

FIELD OF THE INVENTION

The present invention relates to a method for etching a semiconductor material, a method for fabricating a semiconductor device, a method for fabricating a semiconductor laser, and a semiconductor laser. More particularly, the invention relates to a method for etching a III-V compound semiconductor material, a method for fabricating a semiconductor device, and a method for fabricating a semiconductor device employing the semiconductor etching method, and a semiconductor laser fabricated employing the semiconductor etching method.

BACKGROUND OF THE INVENTION

FIGS. 42(a)–42(d) are diagrams illustrating a method for fabricating a semiconductor laser and for explaining a prior art method of etching a semiconductor. In these figures, reference numeral 101 designates a p type InP substrate. Numeral 102 designates a p type InP cladding layer. Numeral 103 designates an InGaAsP active layer. Numeral 104 designates an n type InP cladding layer. Numeral 105 designates an insulating film. Numeral 106 designates a first n type InP current blocking layer. Numeral 107 designates a p type InP current blocking layer. Numeral 108 designates a second n type InP current blocking layer. Numeral 109 designates a p type InP contact layer. Numeral 110 designates an n side electrode. Numeral 111 designates a p side electrode.

A description is given of the method for fabricating the prior art semiconductor laser. First of all, in the step of FIG. 42(a), on a p type InP substrate 101, a p type cladding layer 102, an active layer 103, and an n type cladding layer 104 are successively grown in an MOCVD (metal organic chemical vapor deposition) apparatus. Next, the wafer is taken out from the MOCVD apparatus, a stripe-shaped insulating film 105 is formed on the n type cladding layer 104, the wafer is etched in a liquid from the surface of the n type cladding layer 104 to the p type InP substrate 101, using the insulating film 105 as a mask, with a bromine methanol mixture or a sulfuric acid series etchant, thereby forming a mesa-stripe configuration as shown in FIG. 42(b). Further, in the step of FIG. 42(c), the wafer is returned to the MOCVD apparatus, and the n type InP current blocking layer 106, the p type InP current blocking layer 107, and the second n type InP current blocking layer 108 are selectively regrown to bury the mesa-stripe. Thereafter, the wafer is taken out of the MOCVD apparatus, the insulating film 105 is removed, the wafer is again returned to the MOCVD apparatus, and a contact layer 109 is formed on the mesa-stripe and the second n type InP current blocking layer 108. Further, an n side electrode 110 is formed on the surface of the contact layer 109 by evaporation and a p side electrode 111 is formed on the rear surface of the substrate 101, thereby forming a semiconductor laser as shown in FIG. 42(d).

Since, in this prior art method liquid phase etching using a bromine methanol mixture or a sulfuric acid series etchant is used, control of the etching rate is quite difficult and control of the remaining thickness is quite difficult. In addition, because the etching is carried out by using the etching solution, variations in etching depending on position on the wafer may arise, so the controllability of etching is difficult.

Carrying out the etching and regrowth of a compound semiconductor successively in the MOCVD apparatus in order to avoid oxidation of the regrowth interface and contamination has recently been studied. It was difficult to apply conventional liquid phase etching to etch a semiconductor layer in a semiconductor crystal growth apparatus such as an MOCVD apparatus in view of the structure of the apparatus.

SUMMARY OF THE INVENTION

It is an object of the present invention to provide an etching method for a compound semiconductor material with high controllability and without using a liquid etching solution.

Another object of the present invention is to provide a method of fabricating a semiconductor device and a method of fabricating a semiconductor laser using the etching method.

Yet another object of the present invention is to provide a semiconductor laser that is fabricated by using the etching method.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, an etching method for semiconductor comprises:

etching a III-V compound semiconductor using an etching gas including the Group V element of the III-V compound semiconductor layer and keeping the III-V compound semiconductor layer at a temperature higher than the crystal growth temperature of the III-V compound semiconductor.

Therefore, an etching method having higher controllability than wet etching is provided. In addition, because no etching solution is employed, the etching method can be employed in a crystal growth apparatus. Further, because of the material employed as an etching gas, residual contamination by at the etched surface can be prevented, keeping the etched surface clean.

According to a second aspect of the present invention, in the etching method, a gas including the Group III element of the III-V compound semiconductor layer is added to the etching gas to control etching characteristics. Therefore, a desired etching configuration can be easily obtained.

According to a third aspect of the present invention, in the etching method, the III-V compound semiconductor layer is an InP layer, and the etching is carried out using a gas including phosphorus. Therefore, etching with high controllability can be performed.

According to a fourth aspect of the present invention, in the etching method, the III-V compound semiconductor layer is an InP layer, and the etching is carried out by keeping said InP layer at above 700° C. Therefore, etching with high controllability can be performed.

According to a fifth aspect of the present invention, in the etching method, the III-V semiconductor layer is an InP layer, and the etching is carried out at above 700° C., using $PH_3$ gas at a flow rate of 400 SCCM and $H_2$ gas at a flow rate of 25 SCCM, and at a pressure in the reaction apparatus at 30 Torr. Therefore, etching with high controllability can be performed.

According to a sixth aspect of the present invention, the etching method further comprises:

forming an insulating film with stripe-shaped apertures comprising a plurality of regions having different widths on a main surface of a III-V compound semiconductor layer; and selectively etching the III-V compound semiconductor layer using the insulating film as a mask.

Therefore, etching with high controllability can be performed and shallow etching in wide apertures and deep etching in narrow apertures can be simultaneously performed.

According to a seventh aspect of the present invention, the etching method further comprises:

forming an insulating film with stripe-shaped apertures having different widths in the stripe direction;

selectively etching the III-V compound semiconductor layer using the insulating film as a mask.

Therefore, deep etching at wide apertures and shallow etching in narrow apertures can be simultaneously performed.

According to an eighth aspect of the present invention, an etching method for a semiconductor comprises:

selectively etching only a prescribed region of the surface of the III-V compound semiconductor layer while keeping the III-V compound semiconductor layer in an ambient where an etching gas including the Group V element of the III-V compound semiconductor layer is supplied and heating the prescribed region.

Therefore, etching with high controllability can be performed without employing a selective mask.

According to a ninth aspect of the present invention, the etching method is carried out while holding the III-V compound semiconductor layer at a temperature at which crystal growth of the III-V compound semiconductor is possible. Therefore, selective etching and selective regrowth can be simultaneously performed.

According to a tenth aspect of the present invention, the etching method further comprises:

forming an insulating film having an aperture on a main surface of a III-V compound semiconductor layer;

selectively etching the III-V compound semiconductor layer using said insulating film as a mask using an etching gas including the Group V element forming the III-V compound semiconductor layer and keeping said III-V compound semiconductor layer at a temperature higher than the crystal growth temperature of the III-V compound semiconductor; and growing another semiconductor layer using the insulating film as a mask, after replacing the etching gas used for etching with a crystal growth gas, without the III-V compound semiconductor layer being exposed to the air.

After etching with high controllability without employing an etching solution, the other semiconductor layer can be regrown successively and a semiconductor device having superior characteristics and a clean regrowth interface with fewer impurities, such as an oxide film, can be obtained.

According to an eleventh aspect of the present invention, a method for fabricating a semiconductor device comprises:

forming an insulating film having an aperture on a main surface of a first conductivity type III-V compound semiconductor layer;

selectively etching the first conductivity type III-V compound semiconductor layer using said insulating film as a mask using an etching gas including the Group V element forming the III-V compound semiconductor layer and keeping the III-V compound semiconductor layer at a temperature higher than the crystal growth temperature of the III-V compound semiconductor; and selectively growing a double heterojunction structure comprising a first conductivity type cladding layer, an active layer, and a second conductivity type cladding layer successively, using the insulating film as a mask after replacing the etching gas with a crystal growth gas without the III-V compound semiconductor layer being exposed to air.

Therefore, a semiconductor laser having superior characteristics in which the active layer is parallel to a main surface of the first conductivity type III-V compound semiconductor layer can be provided with high reproducibility.

According to a twelfth aspect of the present invention, a method for fabricating a semiconductor device comprises:

forming an insulating film having an aperture on a main surface of a III-V compound semiconductor layer;

selectively etching the III-V compound semiconductor layer using the insulating film as a mask using an etching gas including the Group V element forming the III-V compound semiconductor layer and keeping the III-V compound semiconductor layer at a temperature higher than the crystal growth temperature of the III-V compound semiconductor; and selectively growing a multi-quantum well structure layer using the insulating film as a mask after replacing the etching gas with a crystal growth gas without the III-V compound semiconductor layer being exposed to the air.

Therefore, a quantum well structure layer that is thin in the region having the wide aperture, and thick in the region having the narrow aperture, and having an equal height with respect to a main surface of the III-V compound semiconductor layer. For example, when applied to the fabrication of an integrated semiconductor laser and light modulator, the height of the multi-quantum well structure layer at the region having the narrow aperture, which is to be a semiconductor laser region, and the height of the multi-quantum well structure layer at the region having the wide aperture, which is to be a light modulator region, can be aligned, whereby an integrated semiconductor laser and light modulator superior in laser light propagating property is obtained.

According to a thirteenth aspect of the present invention, a method for fabricating a semiconductor device comprises selectively etching the III-V compound semiconductor layer using the insulating film as a mask by using an etching gas including the Group V element forming the III-V compound semiconductor layer and keeping the III-V compound semiconductor layer at a temperature higher than the crystal growth temperature of the III-V compound semiconductor. Therefore, a semiconductor device provided with a diffraction grating structure can be produced with high reproducibility.

According to a fourteenth aspect of the present invention, in the etching method, the plurality of stripe-shaped apertures has a stripe length for a prescribed region different from the stripe length of other region.

Therefore, a diffraction grating structure provided with a diffraction grating grooves having different depths, i.e., having a shallow depth in the region having a long stripe and a deep depth in the region having a short stripe, can be formed, simultaneously.

According to a fifteenth aspect of the present invention, in the above-described etching method, the plurality of stripe-shaped apertures have stripe lengths mutually equal to each other, and the insulating film has a width in the direction perpendicular to the arranging direction of the apertures that is narrower than the width of the other region.

Therefore, a diffraction grating structure including a diffraction grating grooves having different depths, i.e., having a deep depth in the region having a wide insulating film and a deep depth in the region having a narrow insulating film can be formed simultaneously.

According to a sixteenth aspect of the present invention, the etching method, further comprises:

after selectively etching the III-V compound semiconductor layer, growing another semiconductor layer using the insulating film by replacing the etching gas with a crystal growth gas without the III-V compound semiconductor layer being exposed to air.

Therefore, a semiconductor device provided with a diffraction grating structure has another semiconductor layer grown in the diffraction grating grooves at a clean interface. For example, when this aspect of the invention is applied to a DFB (distributed feedback laser), a DFB laser that has less loss due to impurities in the regrowth surface of the diffraction grating and having a superior laser characteristics is obtained.

According to a seventeenth aspect of the present invention, a method for fabricating a semiconductor layer comprises:

forming a current blocking layer comprising a III-V compound semiconductor material on a main surface of a first conductivity type III-V compound semiconductor substrate;

forming an insulating film having a stripe-shaped aperture on the surface of the current blocking layer;

forming a stripe-shaped groove by selectively etching the current blocking layer using the insulating film as a mask and an etching gas including Group V element forming the III-V compound semiconductor layer and keeping the III-V compound semiconductor layer at a temperature higher than the growth temperature of the III-V compound semiconductor, to form a stripe-shaped groove; and selectively growing a double-hetero structure comprising a first conductivity type cladding layer, an active layer, and a second conductivity type cladding layer using the insulating film as a mask by replacing the etching gas without the surface of the stripe-shaped groove being exposed to air.

Therefore, a stripe-shaped groove can be formed in the current blocking layer with high controllability and a semiconductor laser having a desired configuration can be produced with a high degree of reproducibility. In addition, the regrowth surface of the stripe-shaped groove can be clean, and a semiconductor laser with superior characteristics can be provided.

According to an eighteenth aspect of the present invention, a method for fabricating a semiconductor laser comprises:

forming a double heterojunction structure comprising a first conductivity type cladding layer, an active layer, and a second conductivity type cladding layer on a main surface of a first conductivity type III-V compound semiconductor substrate;

forming a stripe-shaped insulating film on the double-hetero structure, and forming a mesa stripe by selectively etching the double-hetero junction structure to reach the substrate using the insulating film as a mask by etching using an etching gas including the Group V element forming the III-V compound semiconductor layer and keeping the III-V compound semiconductor layer at a temperature higher than the crystal growth temperature of the III-V compound semiconductor, to form a mesa stripe; and selectively growing a current blocking layer to bury the mesa stripe, using the insulating film as a mask by replacing the etching gas without the surface of the stripe-shaped groove being exposed to air.

Therefore, the double heterojunction structure can be etched into a mesa stripe configuration with high controllability and a semiconductor laser with a desired configuration can be provided with a high degree of reproducibility. In addition, the regrowth interface of the side of the mesa-stripe and the surface of the semiconductor substrate can be clean and a semiconductor laser having a superior characteristics is obtained.

According to a seventeenth aspect of the present invention, a method for fabricating a semiconductor laser comprises:

forming a current blocking layer comprising a III-V semiconductor material on a main surface of a first conductivity type III-V compound semiconductor substrate;

forming an insulating film having a plurality of stripe-shaped parallel apertures and different widths on the surface of the current blocking layer;

forming stripe-shaped grooves by selectively etching the current blocking layer to reach the substrate using the insulating film as a mask and an etching gas including the Group V element forming the III-V compound semiconductor layer and keeping the III-V compound semiconductor layer at a temperature higher than the growth temperature of the III-V compound semiconductor, to form a plurality of stripe-shaped grooves; and selectively growing a double heterojunction structure comprising a first conductivity type cladding layer, a multi-quantum well structure active layer, and a second conductivity type cladding layer, using the insulating film as a mask while replacing the etching gas without the surface of the stripe-shaped groove being exposed to air.

Therefore, it is possible to form simultaneously a double heterojunction structure with a thin multi-quantum well structure active layer in the stripe-shaped groove corresponding to the wide apertures and a double hetero junction structure with a thick multi-quantum well structure active layer in the stripe-shaped groove corresponding to the narrow apertures, and an array type semiconductor laser provided with a plurality of laser elements having different oscillation wavelengths at one time, so the fabrication process can be shortened.

According to a twentieth aspect of the present invention, a method for fabricating a semiconductor laser device comprises:

forming a first insulating film having a plurality of striped shaped parallel apertures having different widths on a main surface of a first conductivity type III-V compound semiconductor substrate;

selectively etching the III-V compound semiconductor substrate using the first insulating film as a mask and an etching gas including the Group V element forming the III-V compound semiconductor layer and keeping the III-V compound semiconductor layer at a temperature higher than the crystal growth temperature of the III-V compound semiconductor, to form a plurality of stripe-shaped grooves;

selectively growing a double heterojunction structure comprising a first conductivity type cladding layer, a multi-quantum well structure active layer, and a second conductivity type cladding layer, using the first insulating film as a mask and replacing the etching gas without the surface of the stripe-shaped groove being exposed to air, filling the plurality of stripe-shaped grooves; and after removing the first insulating film, forming a stripe-shaped second insulating film extending in the length direction of the double heterojunction structure on the double heterojunction structure, and etching the double heterojunction structure using the second insulating film as a mask, to form a mesa-stripe; and forming a current blocking layer burying the mesa-stripe using the second insulating film as a mask.

Thereby, it is possible to form simultaneously a mesa stripe comprising a double heterojunction structure with a thin multi-quantum well structure active layer in the region corresponding to the wide apertures and a mesa stripe comprising a double hetero junction structure with a thick multi-quantum well structure active layer in the region corresponding to the narrow apertures, and an array type semiconductor laser with a plurality of laser elements having different oscillation wavelengths at one time, so the fabrication process can be shortened.

According to a twenty-first aspect of the present invention, a method for fabricating a semiconductor laser comprises:

forming an insulating film having a stripe-shaped aperture on a main surface of a first semiconductor layer comprising a III-V compound semiconductor;

selectively etching the III-V compound semiconductor substrate using the stripe-shaped insulating film as a mask using an etching gas including the Group V element forming the III-V compound semiconductor layer and keeping the III-V compound semiconductor layer at a temperature higher than the temperature of crystal growth of the III-V compound semiconductor, to form a plurality of stripe-shaped grooves;

selectively growing an electron channel layer at the bottom of the stripe-shaped groove using the insulating film and replacing the etching gas with a crystal growth gas without the surface of the stripe-shaped V-shaped grooves being exposed to air; and after the selective growth, selectively growing a second III-V compound semiconductor layer comprising the same material as the first semiconductor layer so as to fill the stripe-shaped grooves.

Thereby, a semiconductor device having a quantum wire structure can be provided with a high degree of reproducibility. In addition, the quantum wire structure can be formed so that the periphery of the electron channel layer is clean and a semiconductor device with superior characteristics is obtained.

According to a twenty-second aspect of the present invention, a method for fabricating a semiconductor device, comprises:

forming an electron channel layer comprising an intrinsic semiconductor layer and a second semiconductor layer comprising an intrinsic III-V compound semiconductor layer electron channel layer on a main surface of a first semiconductor layer;

forming an insulating film having a stripe-shaped aperture on the surface of the second semiconductor layer;

etching the second semiconductor layer using the insulating film as a mask and using an etching gas including the Group V element forming the III-V compound semiconductor layer and keeping the III-V compound semiconductor layer at a temperature higher than the growth temperature of the III-V compound semiconductor, to a depth not reaching the electron channel layer, to form a stripe-shaped V-shaped groove;

selectively growing a third III-V compound semiconductor layer having a prescribed conductivity type comprising the same material as the first semiconductor layer to fill the V-shaped grooves, using the insulating film and replacing the etching gas with a crystal growth gas without the surface of the second semiconductor layer being exposed to air.

Thereby, a quantum wire structure can be produced with high reproducibility. In addition, the quantum wire structure can be formed so that the regrowth surface of the V-shaped groove is made and a semiconductor device with superior characteristic is obtained.

According to a twenty-third aspect of the present invention, a semiconductor laser comprises:

a III-V compound semiconductor layer having a groove on its main surface comprising a plurality of apertures having different widths and the depth of the wide apertures region is deeper than the depth of the narrow aperture region;

a double heterojunction structure including a multi-quantum well layer filling the stripe-shaped grooves, thinner than the narrow width aperture region in the wide aperture region and having a uniform height relative to the main surface of the III-V compound semiconductor layer over the entire surface.

Thereby, it is possible to align the multi-quantum well structure layer as a light emission part of the semiconductor laser region and the multi-quantum well structure layer of light modulator region and an integrated semiconductor laser and light modulator superior in the propagation of the laser light is provided.

According to a twenty-fourth aspect of the present invention, a semiconductor laser comprises:

a first conductivity type III-V compound semiconductor substrate;

a current blocking layer comprising a III-V compound semiconductor material formed on a main surface of the first conductivity type III-V compound semiconductor substrate;

a plurality of stripe-shaped grooves formed by forming a plurality of stripe-shaped parallel apertures having different widths on the surface of the current blocking layer and selectively etching the current blocking layer to the substrate using the insulating film as a mask, an etching gas including the Group V element forming the III-V compound semiconductor layer, and keeping the III-V compound semiconductor layer higher than the crystal growth temperature of the III-V compound semiconductor; and a double heterojunction structure comprising a first conductivity type cladding layer, a multi-quantum well structure active layer, and a second conductivity type cladding layer selectively grown to fill the stripe-shaped groove, by replacing the etching gas with a crystal growth gas without the surfaces of the stripe-shaped grooves being exposed to air.

Thereby, it is possible to form simultaneously on the same substrate a plurality of double hetero junction structures with multi-quantum well structure active layers having different thicknesses.

According to a twenty-fifth aspect of the present invention a semiconductor laser comprises:

a first conductivity type III-V compound semiconductor substrate;

a plurality of mesa-stripes formed by forming a first insulating film having a plurality of parallel stripe-shaped openings having different widths on a main surface of the first conductivity type III-V compound semiconductor substrate, selectively etching the III-V compound semiconductor substrate using the first insulating film as a mask using an etching gas including the Group V element forming the III-V compound semiconductor layer and keeping the III-V compound semiconductor layer at a temperature higher than the crystal growth temperature of the III-V compound semiconductor, to form a plurality of stripe-shaped grooves, selectively growing a double heterojunction structure comprising a first conductivity type cladding layer, a multi-quantum well structure active layer, and a second conductivity type cladding layer filling the plurality of stripe-shaped grooves, and replacing the etching gas used by a crystal growth gas without the surfaces of the plurality of stripe-shaped grooves being exposed to air, after removing the first insulating film, forming a stripe-shaped second insulating film extending in the length direction of the double hetero junction structure on the double heterojunction structure, and etching the double heterojunction structure using the second insulating film as a mask; and forming a current blocking layer burying the mesa-stripe using the second insulating film as a mask.

Therefore, it is possible to form simultaneously on the same substrate a plurality of double heterojunction structures with multi-quantum well structure active layers having different thicknesses. substrate.

BRIEF DESCRIPTION OF THE DRAWINGS

FIGS. 6(a)–6(d) illustrate the relation between the distance between the apertures of a mask and etching rate in thermal etching according to the first embodiment of the present invention.

FIGS. 7(a)–7(c) are cross-sectional views illustrating a method of fabricating a diffraction grating with a V-shaped groove according to a second embodiment of the present invention.

FIGS. 10(a) and 10(b) are diagrams for explaining a method of fabricating a diffraction grating according to a third embodiment of the present invention.

FIGS. 11(a) and 11(b) are diagrams for explaining a method of fabricating a diffraction grating according to a fourth embodiment of the present invention.

FIGS. 14(a)–14(g) are diagrams for explaining a method of fabricating a DFB laser according to a fifth embodiment of the present invention.

DETAILED DESCRIPTION OF THE PREFERRED EMBODIMENTS

Embodiment 1

Figure 1:
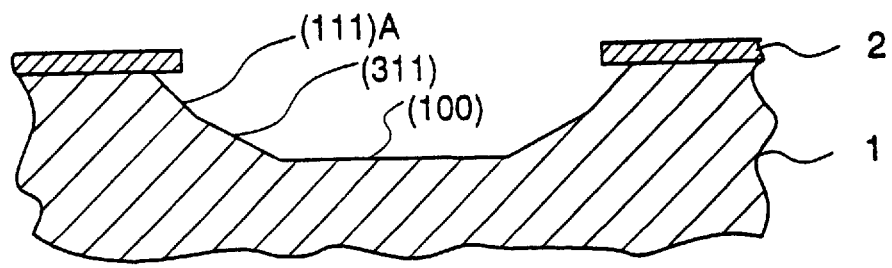
FIGS. 1(a) and 1(b) illustrate configurations of etched grooves formed by thermal etching according to a first embodiment of the present invention.
Figure 1:
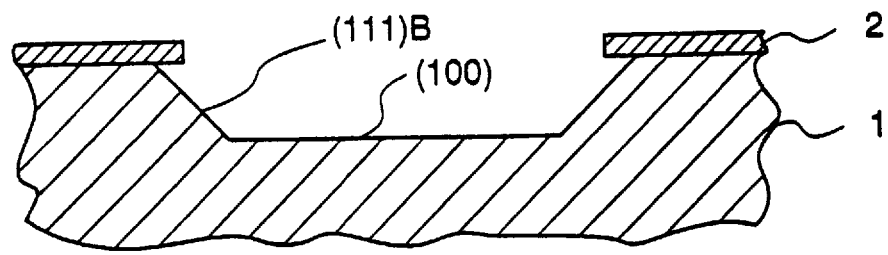

FIGS. 1(a) and 1(b) are diagrams for explaining a semiconductor etching method according to a first embodiment of the present invention in which FIG. 1(a) is a cross-sectional schematic view in a (011) plane of an InP substrate after the etching, and FIG. 1(b) is a cross-sectional schematic diagram in a (011) plane of an InP substrate after the etching. In the figures, reference numeral 1 designates an InP substrate, reference numeral 2 designates an insulating film pattern having an aperture of 5–6 $\mu$m wide.

Figure 2:
FIGS. 2(a) and 2(b) illustrate configurations of ridges formed by thermal etching according to the first embodiment of the present invention.
Figure 2:

FIGS. 2(a) and 2(b) are diagrams for explaining the semiconductor etching method according to a first embodiment of the present invention in which FIGS. 2(a) and 2(b) are cross-sectional views in a (0$\bar{1}$1) plane and a (0$\bar{1}\bar{1}$) plane, respectively, of an InP substrate. In the figures, the same reference numerals designate the same or corresponding elements as in FIG. 1(a). Reference numerals 3a and 3b designate stripe-shaped insulating films extending in the [0$\bar{1}$1] direction and [0$\bar{1}\bar{1}$] direction, respectively.

Figure 3:
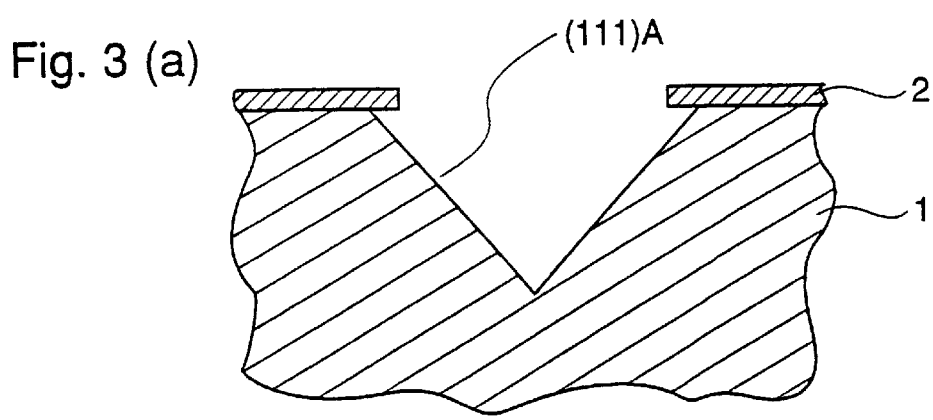
FIGS. 3(a) and 3(b) illustrate configurations of V-shaped grooves formed by thermal etching according to the first embodiment of the present invention.
Figure 3:
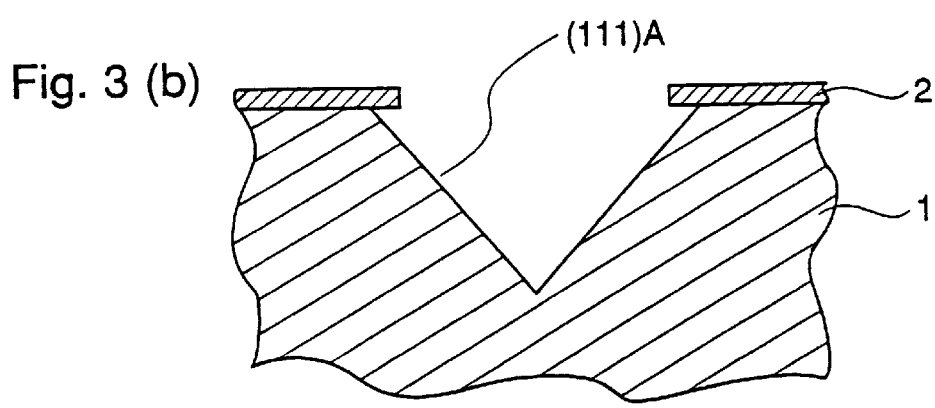

FIGS. 3(a) and 3(b) are cross-sectional views in a (0$\bar{1}$1) plane and a cross-sectional view in a (011) plane, respectively, for explaining the semiconductor etching method according to a first embodiment of the present invention. In the figures, the same reference numerals designate the same or corresponding elements as shown in FIG. 1(a).

A description is given of the etching method according to a first embodiment of the present invention. First of all, an InP substrate 1 having a (100) just plane surface on which an insulating film 2 having an aperture of a prescribed width is formed, is set in an MOCVD (metal organic chemical vapor deposition) apparatus, and held at a temperature about 50° C. above 650° C., at which growth of InP crystal is possible, for one hour in a $PH_3$ gas atmosphere. The etching conditions are substrate temperature Ts: 700° C., pressure of reactor P: 30 Torr, flow rate of $PH_3$: 400 SCCM, and hydrogen flow rate: 25 SCCM. After this etching, the cross-sectional configuration is observed by SEM (scanning electron microscopy), and the etching amount is evaluated by a contact system step measurement and SEM.

The (0$\bar{1}$1) cross-section of the InP substrate 1 after etching has a mesa configuration as shown in FIG. 1(a) and the (100) just plane having a good surface configuration appears at the bottom of the mesa groove. The etching mesa side surfaces in (111)A planes at an upper portion and (311) planes at a lower portion. The sides of the mesa groove are (111)B surfaces.

When the InP substrate 1 is further etched using the insulating film mask 2 having the aperture, the (0$\bar{1}$1) cross-section and the (0$\bar{1}\bar{1}$) cross-section of the etched mesa groove become V-shaped grooves, the side surfaces of which are (111)A planes as shown in FIGS. 3(a) and 3(b). This phenomenon occurs because the etching speed of the (111) plane is larger than the etching speed of the (100) plane in the etching method of the first embodiment.

A stripe-shaped insulating film pattern 3a extending in the [0$\bar{1}$1] direction is formed on the InP substrate 1, and the InP substrate 1 is etched under the conditions described above using the mask, thereby producing a (0$\bar{1}$1) cross-section having a ridge configuration as shown in FIG. 2(a). A (111)A plane is exposed at an upper portion of the side of the ridge and a (311) plane is exposed at a lower portion of the side of the ridge.

A striped-shape insulating film pattern 3b extending in the [0$\bar{1}\bar{1}$] direction is formed, and the InP substrate 1 is etched using the insulating film pattern 3b as a mask, thereby forming a (0$\bar{1}\bar{1}$) cross-section of the substrate 1 as shown in FIG. 2(b), the ridge side then becoming a (111)B surface.

FIGS. 4(a) and 4(b) are a diagram illustrating the result of a contact system step measurement of the etching depth when the InP substrate 1 is etched using the insulating film 4 with a plurality of stripe-shaped openings and a cross-sectional schematic diagram in the stripe width direction of the substrate 1, respectively. FIGS. 4(a) and 4(b) show that the depth of etching becomes deeper and the etching speed becomes faster as the width of the opening increases.

Figure 4:
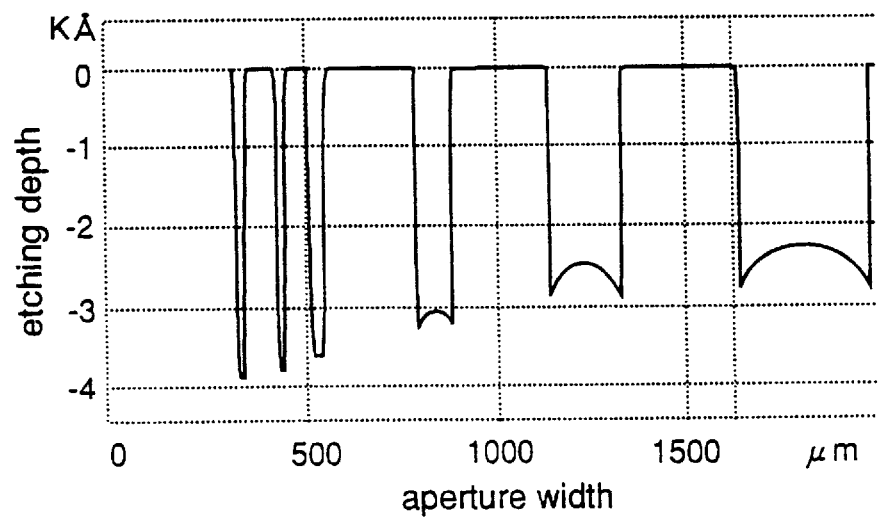
FIGS. 4(a) and 4(b) are a diagram illustrating a relation between etching depth and aperture width, which shows the relation between the aperture width of a mask and etching rate, and a cross-sectional view of the apertures according to the first embodiment of the present invention.
Figure 4:
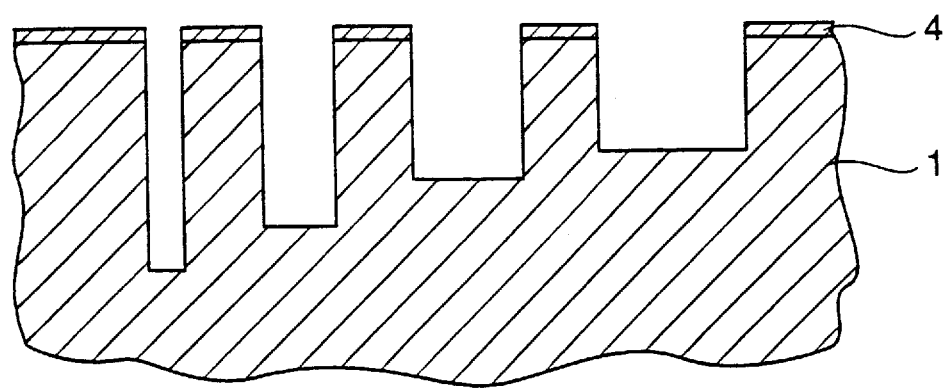
Figure 5:
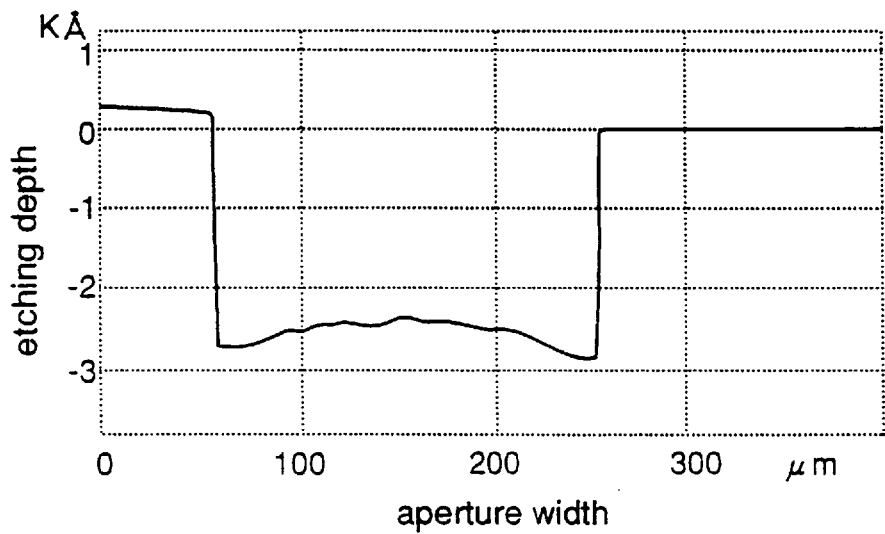
FIGS. 5(a) and 5(b) are a diagram illustrating a relation between etching depth and aperture width, which shows differences in the etching rates in the apertures, and a cross-sectional view of the apertures according to the first embodiment of the present invention.
Figure 5:
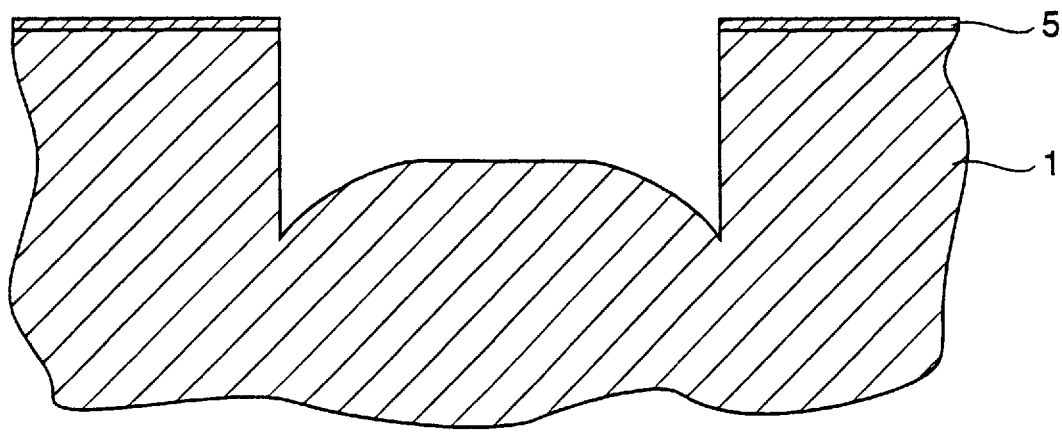

FIGS. 5(a) and 5(b) are a diagram illustrating the result of a contact system step measurement of the etching depth when the InP substrate 1 is etched using the insulating film 5 with an opening having a width of 200 μm as a mask, and a cross-sectional schematic diagram of the substrate 1, respectively. FIGS. 5(a) and 5(b) show that the etched groove becomes shallower the farther it is spaced from the mask, so the etching rate is larger nearer the mask. The contact step measurement shown in FIGS. 4(a) and 4(b) and 5(a) and 5(b) is high in precision in the depth direction of the groove and low in the width direction. The widths of the openings in the insulating films 4 and 5 are significantly larger than the widths of the openings in the insulating film 2 shown in FIG. 1(a). Although the side surface of the etched groove is illustrated as close to perpendicular to the surface of the substrate 1, the actual side surface of the etched groove is an inclined surface.

FIGS. 6(a)–6(d) are plan views (FIGS. 6(a) and 6(b)) and cross-sectional views (FIGS. 6(c) and 6(d)) of the InP substrate 1 etched using the insulating film pattern 6a having a plurality of openings having equal widths and disposed at a prescribed interval and using the insulating film pattern 6b having a plurality of openings having the same widths as the insulating film pattern 6a and having wider intervals between the openings than the patterns 6a, respectively, according to the first embodiment of the present invention. The cross-sections of the InP substrate 1 after the etching using the insulating film patterns 6a and 6b as shown in FIGS. 6(a) and 6(b) are shown in FIGS. 6(c) and 6(d), respectively. A high etching rate is possible using the insulating film pattern 6b having a wide interval between openings.

In the first embodiment of the present invention, etching of InP is carried out by keeping the temperature of the InP layer in a $PH_3$ atmosphere about 50° C. higher than the crystal growth temperature of InP. Therefore, etching superior in controllability is achieved.

While in the first embodiment the etching temperature is kept about 50° C. higher than the crystal growth temperature of InP, the etching temperature may still be a higher. The substrate temperature and the partial pressure of $PH_3$ in the first embodiment are only examples. Since the etching speed depends on the pressure of $PH_3$, flow rate of $PH_3$, and the like, etching speed can be made slow, about 1 nm/min, and such a slow etching rate enhances the controllability.

Embodiment 2

FIGS. 7(a)–7(c) are diagrams illustrating a method for fabricating a diffraction grating according to a second embodiment of the present invention using the thermal etching process of the first embodiment. In the figures, reference numeral 1 designates an InP substrate and reference numeral 7 designates a diffraction grating mask comprising an insulating film.

As shown in FIG. 7(a), a diffraction grating 7 with a plurality of stripe-shaped openings arranged with 1000–1500 angstrom pitch in the [0$\bar{1}$1] direction is formed on the (100) plane surface of the InP semiconductor substrate 1. Next, as shown in FIG. 7(b), the InP substrate 1 is etched by the thermal process described as the first embodiment, using the diffraction grating mask 7 as a mask. Then, the inclined plane surfaces in the lattice arranging direction of the grooves of the diffraction grating ares (111) planes and the bottom surface is the (100) plane. As shown in FIG. 7(c), the insulating film 7 is removed to produce a diffraction grating.

In this embodiment, the diffraction grating is formed by thermal etching. Therefore, the diffraction grating can be obtained with higher controllability than when wet etching is used. In addition, as described in the first embodiment, the etching speed can be controlled by controlling the $PH_3$ partial pressure, the $PH_3$ flow rate, the substrate temperature, and the like. By controlling the etching speed to be about 1 nm/min, it is possible to form a diffraction grating of minute height, about 10 nm, with excellent controllability.

Figure 8:
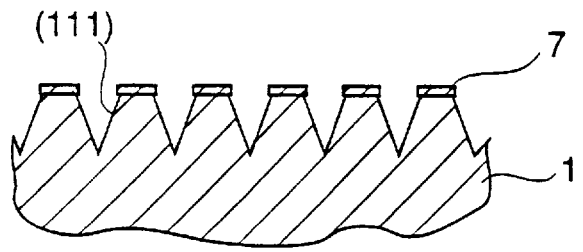
FIG. 8 is a cross-sectional view of a diffraction grating including a V-shaped groove according to a second embodiment of the present invention.

After the thermal etching, a further thermal etching may be carried out to form a V-shaped groove comprising (111) planes as grooves of the diffraction grating as shown in FIG. 8. In this case, when the V-shaped grooves comprising a (111) plane are formed, the etching speed is slow and it appears the etching is stopped. Accordingly, when a diffraction grating having a V-shaped cross-section for grooves is formed, control of the configuration of the diffraction grating is simplified.

While in the described embodiment the arranging direction of the stripe grooves of the diffraction grating is the (0$\bar{1}$1) direction, the present invention can be applied where the arranging direction of the stripe-shaped grooves of the diffraction grating is another direction, such as the (0$\bar{1}\bar{1}$) direction. Also in these cases, the same effects as in the second embodiments are obtained.

Figure 9:
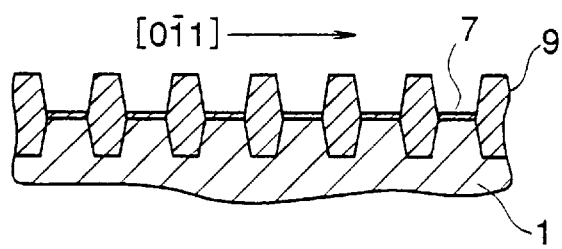
FIGS. 9(a)–9(c) are cross-sectional views illustrating a method of fabricating a diffraction grating according to an alternative of the second embodiment of the present invention.
Figure 9:
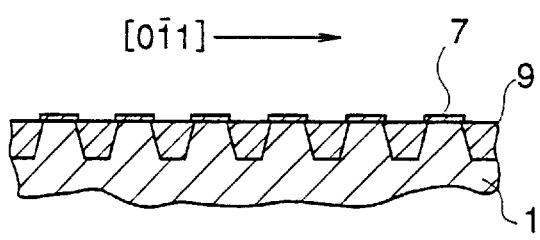
Figure 9:
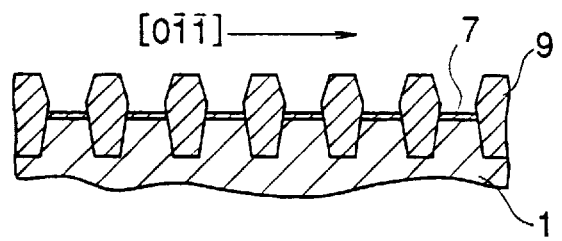
Figure 9:
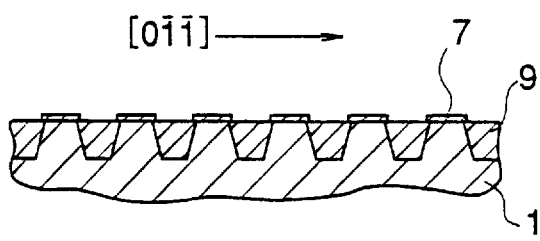

After the diffraction grating is formed, a semiconductor layer may be formed in the diffraction grating. FIGS. 9(a) and 9(c) are cross-sections in (0$\bar{1}\bar{1}$) directions and FIGS. 9(b) and 9(d) are cross-sections in (0$\bar{1}\bar{1}$) directions for explaining a method of fabricating a diffraction grating as an alternative second embodiment of the present invention. In the figures, the same reference numerals designate the same or corresponding elements. Reference numeral 9 designates a regrown layer comprising a semiconductor material such as InP.

The InP substrate 1 on which an insulating film 7 is formed is placed in the MOCVD apparatus and the diffraction grating is formed by etching as shown in FIG. 7(b) and, thereafter, the ambient in the apparatus is replaced by a crystal growth ambient without the substrate 1 being exposed to air, and the regrowth layer 9 is grown. For example, when the arranging direction of the diffraction grating is [0$\bar{1}$1], a projection having a trapezoidal cross-section is formed on a surface of the substrate 1 as shown in FIG. 9(a). When the arranging direction of the diffraction grating is [0$\bar{1}\bar{1}$], a projection having a trapezoidal cross-section at its upper part and a reverse trapezoidal cross-section at its lower part is formed as shown in FIG. 9(b). Here, in both of the arranging directions of the diffraction grating, [0$\bar{1}$1] or [0$\bar{1}\bar{1}$], the growth of the regrowth layer 9 may be stopped at the surface of the substrate 1 as shown in FIGS. 9(c) and 9(d). In such cases, the semiconductor layer, such as InP, can be grown without being exposed to air after etching of the InP substrate, and contamination, such as oxide films is avoided.

While in the alternative of the second embodiment, when the arranging direction of the stripe groove of the diffraction grating is the [0$\bar{1}$1] or [0$\bar{1}\bar{1}$] direction, the present invention can be applied where the arranging direction of the stripe groove is another direction with the same effects. While in the alternative of the second embodiment, InP is regrown on the diffraction grating, any layer for protecting the etched surface may be grown.

While in the alternative of the second embodiment the regrown layer is formed on the diffraction grating to suppress the contamination of the regrowth interface, in the present invention, after forming a grating groove on a semiconductor layer, such as a substrate, by thermal etching, a layer comprising a material which is to be a diffraction grating layer may be selectively grown as shown in FIGS. 9(a) and 9(b).

Embodiment 3

FIGS. 10(*a*) and 10(*b*) are diagrams for explaining a method of fabricating a diffraction grating using the thermal etching described as the first embodiment, according to a third embodiment of the present invention. In the figures, the same reference numerals as those in FIG. 1(*a*) designate the same or corresponding elements. Reference numeral 10 designates an insulating film with a stripe-shaped aperture extending in the [0$\overline{1}$1] direction, and having a width broader than the width of the other region.

Figure 12:
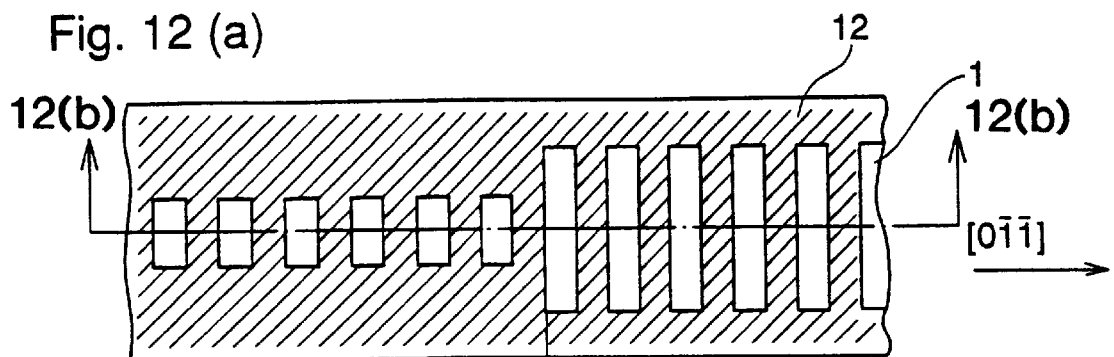
FIG. 12(a) and 12(b) are diagrams for explaining a method of fabricating a diffraction grating according to a third embodiment of the present invention.
Figure 12:
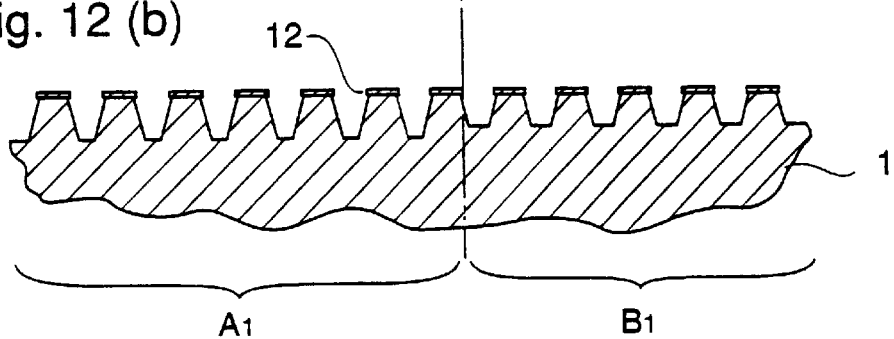

FIGS. 12(*a*) and 12(*b*) are diagrams for explaining a method of fabricating a diffraction grating according to a third embodiment of the present invention. In the figures, reference numeral 12 designates a diffraction grating mask comprising an insulating film having a plurality of stripe-shaped apertures arranged in the [0$\overline{1}$1] direction with pitches of 1000–1500 Å. The stripe-shaped apertures at a region B1 in the [0$\overline{1}$1] direction of the diffraction grating have a stripe length longer than the apertures region A1. For example, the stripe length of the apertures in the region A1 is about 50 $\mu$m and the stripe length of the apertures of the region B1 is several hundred microns.

A description is given of the fabricating method. As shown in FIG. 12(*a*), a diffraction grating 12 having stripe-shaped parallel apertures arranged on a (100) surface of the InP substrate 1 with pitches of 1000–1500 Å is formed. Next, the InP substrate 1 is etched using the diffraction grating as a mask employing the thermal etching method of the first embodiment.

As described for the first embodiment with reference to FIGS. 4(*a*) and 4(*b*), the depth of the thermal etching increases as the width of the aperture becomes narrower. The result of the thermal etching using an aperture pattern as shown in FIG. 10(*a*), in cross-section, is illustrated in FIG. 10(*b*). The etching depth in the stripe-shaped apertures having a large width is smaller than the etching depth where the apertures have smaller width. Therefore, the cross-section after the thermal etching of the InP substrate 1 is as shown in FIG. 12(*b*). A diffraction grating in which the etched grooves in the region B1 are shallower than the grooves in the region A1 is formed.

In this third embodiment, similar effects as in the second embodiment are obtained and grooves of a diffraction grating having different depths can be obtained at the same time, thereby shortening the fabricating process of the diffraction grating.

Embodiment 4

FIGS. 11(*a*) and 11(*b*) are diagrams for explaining a method of fabricating a diffraction grating using the thermal etching of the first embodiment according to a fourth embodiment of the present invention. In these figures, the same reference numerals as in FIG. 1(*b*) designates the same or corresponding elements. Reference numeral 11 designates an insulating film including stripe-shaped apertures. This insulating film has a width at one end, in the stripe length direction, smaller than the width of the insulating film in another region, and the apertures have a constant width.

Figure 13:
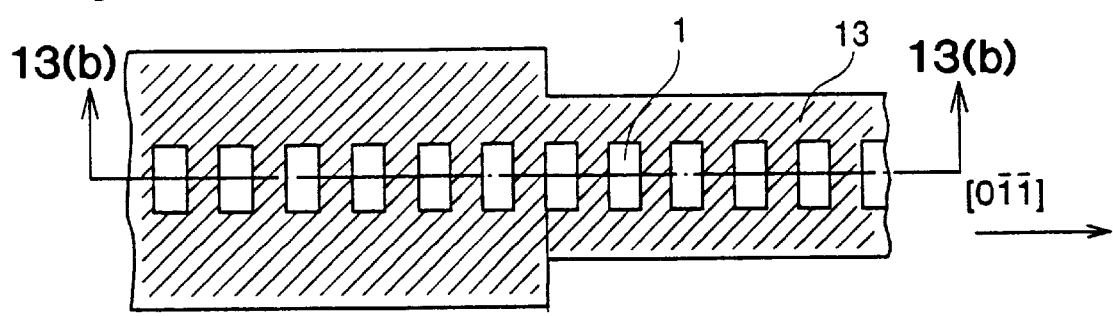
FIGS. 13(a) and 13(b) are diagrams for explaining a method of fabricating a diffraction grating according to a fourth embodiment of the present invention.
Figure 13:
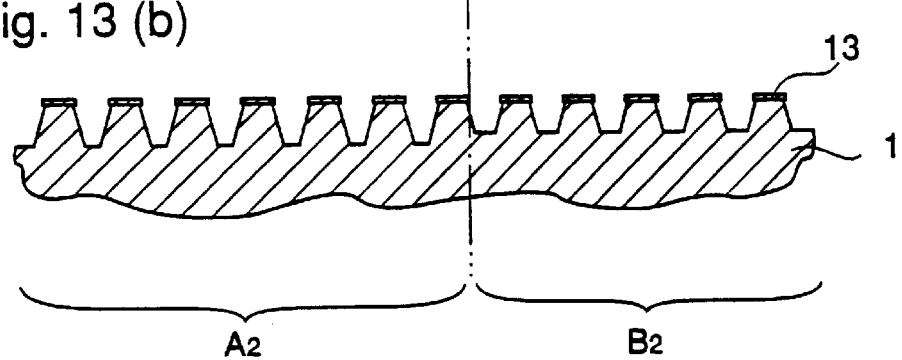

FIGS. 13(*a*) and 13(*b*) are diagrams for explaining a method of fabricating a diffraction grating according to a fourth embodiment of the present invention. In these figures, the same reference numerals as those in FIG. 1(*a*) designate the same or corresponding elements. Reference numeral 13 designates a diffraction grating mask comprising an insulating film having a plurality of apertures arranged parallel to the [0$\overline{1}$1] direction with pitches of 1000–1500 Å. The diffraction grating mask 13 has a width in the region B2 that is narrower than the width in the region A2. The stripe length of the stripe-shaped apertures is uniform.

A fabricating method will be described. As shown in FIG. 13(*a*), on a (100) surface of an InP substrate 1, a diffraction grating mask 13 having parallel stripe-shaped apertures with prescribed pitches of 1000–1500 Å is formed. Next, the InP substrate 1 is thermally etched, using the diffraction grating mask 13, by the thermal etching process of the first embodiment.

As described in the first embodiment with reference to FIGS. 6(*a*)–6(*d*), the depth of thermal etching in an aperture of the mask increases as the widths of masks adjacent to each increases. Therefore, when the InP layer 1 is thermally etched using the aperture pattern as shown in FIG. 11(*a*), the etching depth, in cross-section, is as shown in FIG. 11(*b*). Particularly, in the region of the stripe-shaped aperture adjacent to a portion of the insulating film 11 having a wide width, the etching depth is larger than the etching depth in the other portions of the mask. In this fourth embodiment, the depth of the groove etched through the aperture of the insulating film in the region B having a narrow width is shallower than the depth of the groove etched through the aperture of the insulating film 13 provided in the region A2 having a wide width. Accordingly, the cross-section after the thermal etching of the InP substrate 1 is as shown in FIG. 13(*b*). In other words, a diffraction grating in which the etched grooves in the region B2 are shallower than the etched grooves in the region A2 opposite the [0$\overline{1}$1] direction.

In this fourth embodiment, diffraction gratings having grooves with different depths can be simultaneously obtained as in the third embodiment.

Embodiment 5

FIGS. 14(*a*)–14(*f*) show a cross-sectional view and a flowchart illustrating manufacture of a DFB (distributed feedback) semiconductor laser using the thermal etching process of the first embodiment, according to a fifth embodiment of the present invention. FIGS. 14(*a*), 14(*d*)–14(*f*) are cross-sectional views in the resonator width direction of the semiconductor laser and FIGS. 14(*b*) and 14(*c*) are cross-sectional views in the resonator length direction of the semiconductor laser.

In these figures, reference numeral 21 designates a p type InP substrate, reference numeral 22 designates a p type cladding layer, reference numeral 23 designates an InGaAsP active layer, reference numeral 24 designates an InP light guiding layer, reference numeral 25 designates an InGaAsP diffraction grating layer, reference numeral 26 designates an n type InP cladding layer. Numeral 32 designates an insulating film pattern, numeral 27*a* designates a first p type burying layer, numeral 28 designates an n type InP burying layer, numeral 29 designates an InP contact layer, numeral 30 designates an n side electrode and numeral 31 designates a p side electrode. Further, reference character S1 designates a first step crystal growth process, character S2 designates a diffraction grating formation process, character S3 designates a second step crystal growth process, character S4 designates a waveguide formation process, character S5 designates a third step formation process, and character S6 designates an electrode forming process.

First of all, as the first step crystal growth process S1 shown in FIG. 14(*a*), in the MOCVD apparatus, on a (100) just surface of the p type InP substrate 21, the p type InP cladding layer 2, the InGaAsP active layer 23, the n type InP light guiding layer 24, and the InGaAsP diffraction grating layer 25 are successively grown.

Next, in the step of FIG. 14(*b*), which is the diffraction grating forming process S2, the wafer is taken out from the MOCVD apparatus, and an insulating film (not shown) is formed on the diffraction grating layer 25. A stripe-shaped diffraction grating pattern 32 having parallel lines with 1000–1500 Å pitches in the [0$\bar{1}$1] direction is formed on the insulating film. Thereafter, in the MOCVD apparatus, using the insulating film pattern as a mask, the surface of the InGaAsP diffraction grating layer 25 adjacent to the n type InP light guiding layer 24 is etched using the thermal etching process described as the first embodiment, thereby forming a groove having a (111) facet surface, and producing a diffraction grating.

Subsequently, after the wafer is taken out from the MOCVD apparatus and the insulating film pattern 32 is removed, the second step crystal growth process S3 is performed to grow an n type InP cladding layer 26 burying the diffraction grating.

Next, a stripe-shaped insulating film pattern (not shown) extending in the resonator length direction is formed on the n type InP cladding layer 26, and using this pattern as a mask, wet etching, using the bromine methanol mixture, from the surface of the n type InP cladding layer 26 to the InP substrate 21, is performed thereby forming a waveguide (a mesa stripe) in the waveguide formation step S4 shown in FIG. 14(e). Thereafter, in the step of FIG. 14(e), the third step crystal growth S5 is performed, and, after the first p type InP burying layer 27a, the n type InP burying layer 28 and the second p type InP burying layer 27b are formed, the contact layer 29 is grown, and, in the step of FIG. 14(f), an n side electrode 30 is formed on the contact layer 29, and a p side electrode 31 is formed on the rear surface of the substrate 21 in the electrode formation process S6, thereby forming a long wavelength DFB laser diode.

As described above, according to this fifth embodiment, since the thermal etching described in the first embodiment is used in place of wet etching, the etching can be high controlled and a high precision DFB laser can be obtained.

Embodiment 6

FIGS. 15(a)–15(d) are diagrams illustrating the main process steps of a method of fabricating a DFB laser diode according to a sixth embodiment of the present invention. In FIGS. 15(a)–15(d), the reference numerals designate the same or corresponding elements as in FIGS. 14(a)–14(e). Reference numeral 26a designates a first n type InP cladding layer and numeral 26b designates a second n type InP cladding layer.

Figure 15:
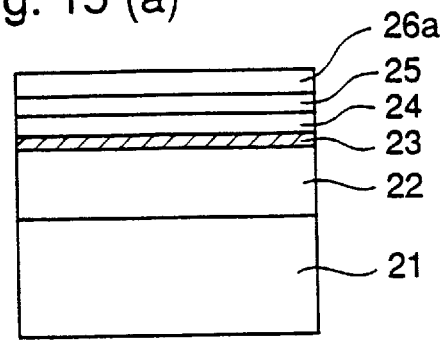
FIGS. 15(a)–15(d) are diagrams for explaining a method of fabricating a DFB laser according to a sixth embodiment of the present invention.
Figure 15:
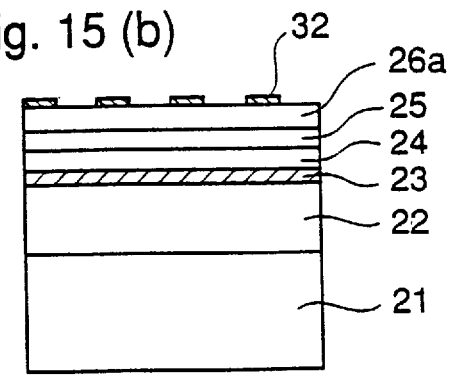
Figure 15:
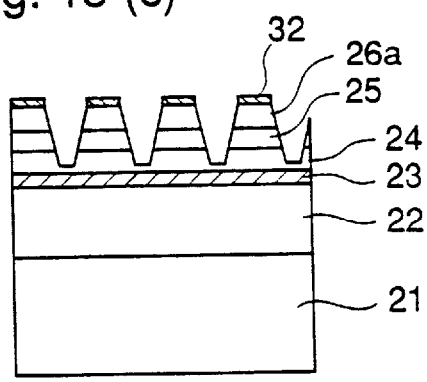
Figure 15:
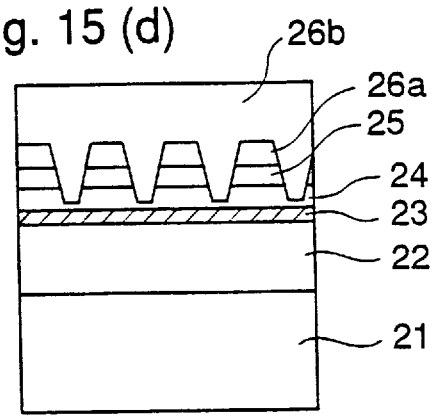

This sixth embodiment is constructed such that the first n type InP cladding layer 26a is formed on the surface of the diffraction grating layer 25 in the first step crystal growth as shown in FIG. 15(a), the diffraction grating pattern 32 is formed on the surface as shown in FIG. 15(b), the thermal etching is performed from the surface of the first InP cladding layer 26a to reach the n type InP light guiding layer 24 using the diffraction grating pattern 32 as a mask, to form a groove having a (111) surface as shown in FIG. 15(c). The second n type InP cladding layer 26b is formed as shown in FIG. 15(d). The same effects as in the fifth embodiment are obtained.

Embodiment 7

Figure 16:
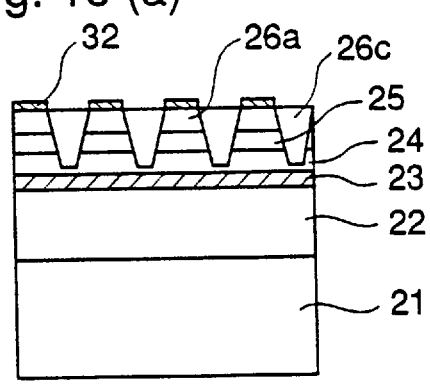
FIGS. 16(a) and 16(b) are diagrams for explaining a method of fabricating a DFB laser according to a seventh embodiment of the present invention.
Figure 16:
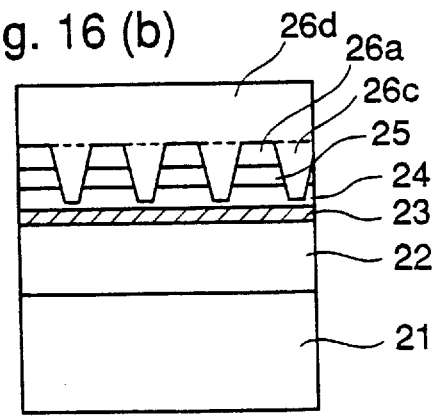

FIGS. 16(a) and 16(b) are cross-sectional views of main process steps of a method of fabricating a DFB semiconductor laser according to a seventh embodiment of the present invention. In the figures, the same reference numerals as those shown in FIGS. 15(a)–15(d) designate the same or corresponding elements. In the figures, reference numeral 26c designates a third n type InP cladding layer and numeral 26d designates a fourth n type InP cladding layer.

In this sixth embodiment, after forming a diffraction grating groove by thermal etching in an MOCVD apparatus in the step of FIG. 15(c), the wafer is taken out of the MOCVD apparatus, the diffraction grating pattern 32 is removed, and the second n type InP cladding layer 26b is again grown in the MOCVD apparatus. In this seventh embodiment, after a groove is formed by thermal etching as shown in FIG. 16(a), without taking the wafer out of the MOCVD apparatus, i.e., without being exposed to air, the ambient in the MOCVD apparatus is changed to an ambient for crystal growth and the third cladding layer 26c is again grown to the same thickness as that of the first n type InP cladding layer 26. Then the wafer is taken out of the MOCVD apparatus, and the diffraction grating pattern 32 is removed, and, as shown in FIG. 16(d), the fourth InP cladding layer 26d is grown.

In the prior art semiconductor laser provided with the diffraction grating structure such as a DFB laser, an oxide film is formed on the regrowth interface on the diffraction grating, during the regrowth, and energy levels due to the impurities are produced on the surface of the diffraction grating, the loss of light increases, and preferable laser characteristics are not obtained. However, in this seventh embodiment, without the regrowth interface of the diffraction grating layer 25 being exposed to air, contamination by such as oxide films on the surface of the diffraction grating layer 25 is suppressed, and a DFB laser having a clean regrowth interface can be obtained. As a result, no energy levels due to impurities are formed on the surface of the diffraction grating and a DFB laser having less loss of light is obtained.

Embodiment 8

FIGS. 17(a)–17(d) are diagrams illustrating a method of fabricating a DFB laser according to an eighth embodiment of the present invention. In the figures, the same reference numerals designate the same or corresponding elements as those in FIGS. 14(a)–14(e). Reference numeral 35 designates an n type InP substrate, numeral 36 designates an n type InGaAsP light guiding layer.

Figure 17:
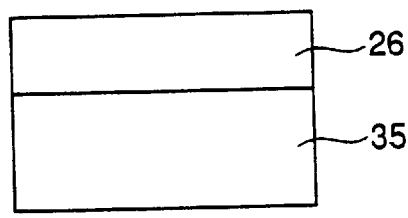
FIGS. 17(a)–17(d) are diagrams for explaining a method of fabricating a DFB laser according to an eighth embodiment of the present invention.
Figure 17:
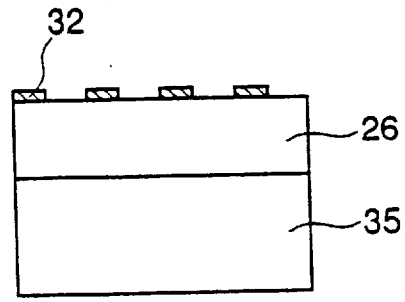
Figure 17:
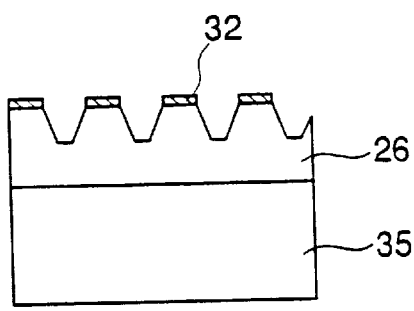
Figure 17:
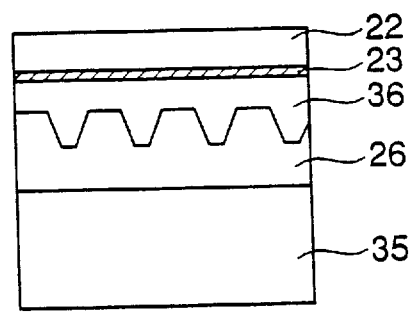

In the DFB laser of this eighth embodiment, the conductivity types of respective layers are reversed from those in the fifth embodiment, the diffraction grating is formed between the active layer 23 and the n type InP substrate 35 and the material of the light guiding layer 36 is n type InGaAsP. As in the fifth embodiment, as shown in FIG. 17(a), the n type InP cladding layer 26 is grown on the n type InP substrate 35, the diffraction grating pattern 32 is formed on the n type InP cladding layer 26 as shown in FIG. 17(b), the diffraction grating groove is formed by the thermal etching process of the first embodiment as shown in FIG. 17(c), the insulating film 32 is removed, and the light guiding layer 36, the active layer 23, and the n type InP cladding layer 22 are formed, whereby the same effects as in the fifth embodiment are obtained.

Figure 18:
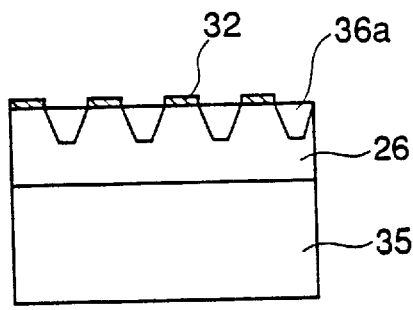
FIGS. 18(a) and 18(b) are diagrams for explaining a method of fabricating a DFB laser according to an alternative of the eighth embodiment of the present invention.
Figure 18:
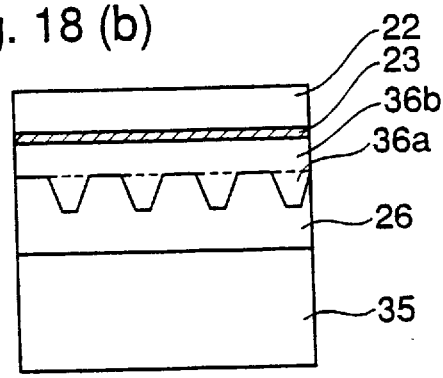

In the eighth embodiment, the n type InGaAsP light guiding layer 36 is formed. However, as shown in FIG. 18(a), it may be that after the diffraction grating groove is formed by thermal etching, without taking the wafer from the MOCVD apparatus, i.e., without the wafer being exposed to air and with replacement of the ambient in the MOCVD apparatus by the ambient for crystal growth, the first n type InP GaAsInP light guiding layer 36b is again grown. Thereafter, the wafer is taken out of the MOCVD apparatus, as shown in FIG. 18(b), and, after removing the diffraction grating pattern 32, the second n type InGaAsP light guide layer 36b is grown. In this case, the same effects as in the eighth embodiment are obtained and a laser diode with superior characteristics having a clean regrowth interface in the diffraction grating structure is obtained.

Embodiment 9

FIGS. 19(a)–19(d) are diagrams illustrating a method of fabricating a DFB laser according to a ninth embodiment of the present invention. In the figures, the same reference numerals designate the same or corresponding elements as those in FIG. 14(a)–14(d). Reference numerals 24a and 24b designate first and second n type InP light guiding layer, and reference numeral 37 designates an n type InGaAsP diffraction grating layer.

Figure 19:
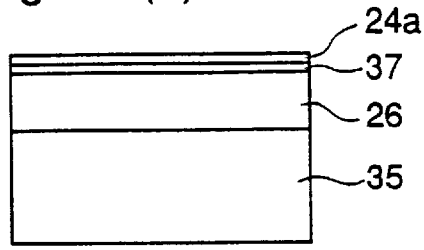
FIGS. 19(a)–19(d) are diagrams for explaining a method of fabricating a DFB laser according to a ninth embodiment of the present invention.
Figure 19:
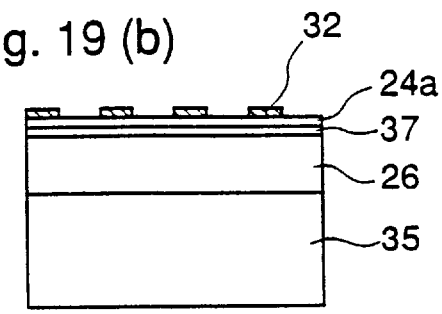
Figure 19:
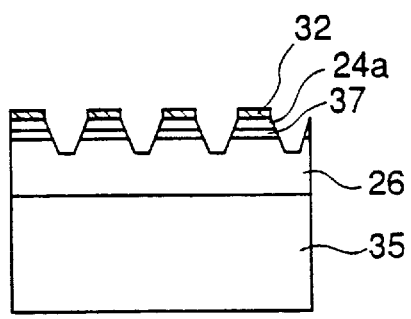
Figure 19:
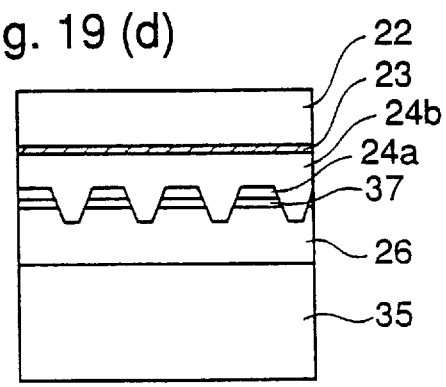

This ninth embodiment employs the first and second light guiding layers 24a and 24b in place of the n type InGaAsP light guiding layer 36. More particularly, on the n type InP substrate 35, the n type InP cladding layer 26, the n type InGaAsP layer 37, and the first InP light guiding layer 24a are formed as shown in FIG. 19(a). A diffraction grating pattern 32 is formed on the surface as shown in FIG. 19(b), and, using the pattern 32 mask, thermal etching is performed from the first InP light guiding layer 24a to the n type InP cladding layer 26, forming a groove having a (111) surface (FIG. 19(c)). Further, after the diffraction grating pattern 32 is removed, the second n type InP light guiding layer 24b is formed to fill the groove, with the same effects as in the above-described embodiment.

Figure 20:
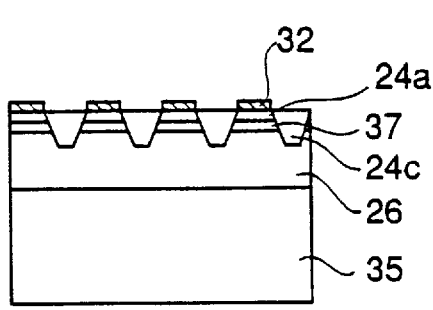
FIGS. 20(a) and 20(b) are diagrams for explaining a method of fabricating a DFB laser according to an alternative of the ninth embodiment of the present invention.
Figure 20:
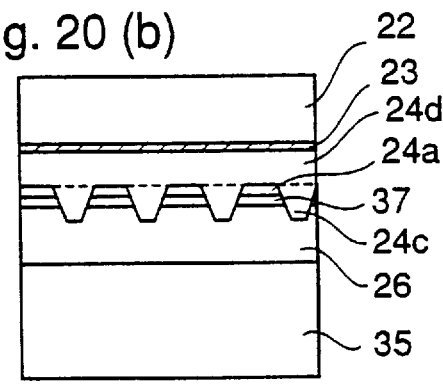

In the ninth embodiment, the n type InP light guiding layer 24b is formed. However, as shown in FIG. 20(a), it may be that after the diffraction grating groove is formed by the thermal etching, without taking the wafer out of the MOCVD apparatus, i.e., without the wafer being exposed to air and with replacing the ambient in the MOCVD apparatus with the ambient for crystal growth, the third InP light guiding layer 24c is again grown. Then, the wafer is taken out of the MOCVD apparatus, the insulating film is removed, and the fourth n type InP light guiding layer 24d is grown. The same effects as in the eighth embodiment are obtained and a laser diode with superior characteristics having a clean regrowth interface is obtained.

Embodiment 10

FIGS. 21(a)–21(d) are cross-sectional views in the resonator length direction illustrating a method of fabricating a DFB laser according to a tenth embodiment of the present invention. In the figures, the same reference numerals designate the same or corresponding elements as those in FIGS. 14(a)–14(d). Reference numeral 38 (the same numeral is used for a different layer) designates an n type InGaAsP regrowth layer.

Figure 21:
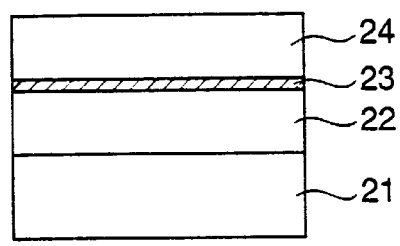
FIGS. 21(a)–21(d) are diagrams for explaining a method of fabricating a DFB laser according to a tenth embodiment of the present invention.
Figure 21:
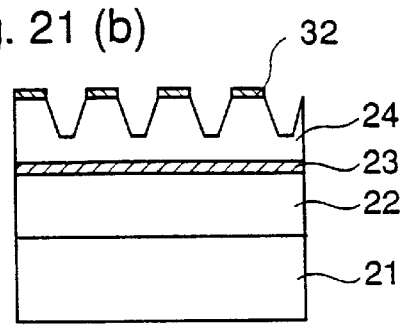
Figure 21:
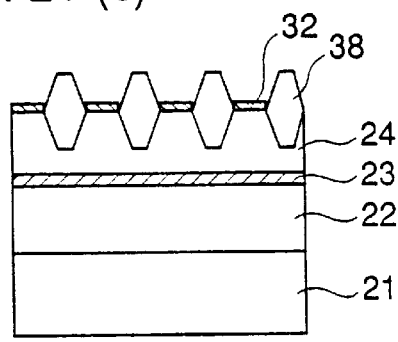
Figure 21:
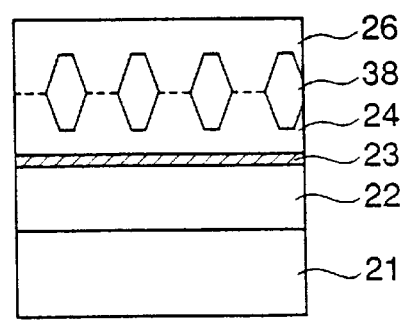
Figure 22:
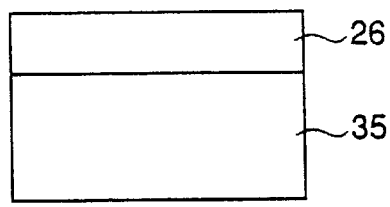
FIGS. 22(a)–22(d) are diagrams for explaining a method of fabricating a DFB laser according to an alternative of the tenth embodiment of the present invention.
Figure 22:
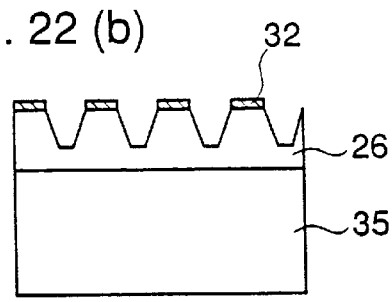
Figure 22:
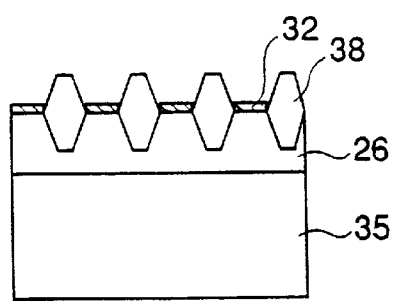
Figure 22:
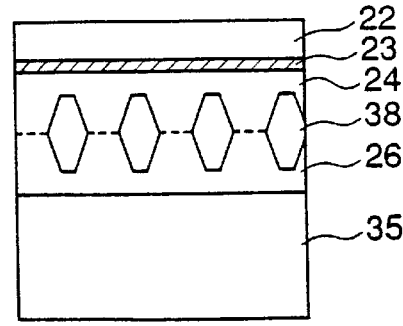

In the fifth embodiment, as shown in FIG. 14(a), the n type InP cladding layer 24 and the n type InGaAsP diffraction grating layer 25 are disposed on the active layer 23, and the n type InGaAsP diffraction grating layer 25 is thermally etched using the diffraction grating mask 32, to form the diffraction grating as shown in FIG. 14(b). In this tenth embodiment, as shown in FIG. 21(a), the n type InP cladding layer 24 is formed on the active layer 23, thermal etching is performed using the diffraction grating pattern 32 in the MOCVD apparatus (FIG. 21(b)). Thereafter, after the ambient in the MOCVD apparatus is replaced by the ambient for crystal growth, without the wafer being exposed to air, a stripe-shaped n type InGaAsP regrowth layer 38 extending in the resonator width direction and having a trapezoidal cross-section in the resonator length direction is again grown in the groove formed by the thermal etching of the n type InP cladding layer 24 (FIG. 21(c)). The diffraction grating pattern 32 is removed and, after forming the n type InP cladding layer 26, a semiconductor laser is formed by a process as in the fifth embodiment, and the same effects as in the fifth embodiment are obtained as in this tenth embodiment.

In this tenth embodiment, a description is given of a case in which the method of fabricating a semiconductor laser shown in the fifth embodiment is used. However, the present invention can be applied to a method of fabricating a semiconductor laser with another diffraction grating. For example, when the method of fabricating the eighth embodiment is used, as shown in FIGS. 22(a)–22(d), the n type InP cladding layer 26 is formed on the n type InP substrate 35 (FIG. 22(a)) and thermally etched using the diffraction grating pattern 32 in the MOCVD apparatus (FIG. 22(b)). Thereafter, with the ambient inside MOCVD apparatus replaced by the ambient for crystal growth without the wafer being exposed to air, a stripe-shaped n type InGaAsP layer 38 extending in the resonator width direction and having a trapezoidal cross-section in the resonator length direction is regrown in the groove formed by the thermal etching of the n type InP cladding layer 26, thereby forming a diffraction grating (FIG. 22(c)). The n type InP light guiding layer 24, the InGaAsP active layer 23, and the p type InP cladding layer 22 are formed, and thereafter, a process as in the eight embodiment is carried out, thereby forming a semiconductor laser. The same effects as in the tenth embodiment are obtained.

In the fifth to tenth embodiments, the arranging direction of the grooves of the diffraction grating was the [0$\overline{1}\overline{1}$] direction. The arranging direction of the grooves of the diffraction grating can be another directions, such as any <0 $\overline{1}$1> direction, and the same effects as in the embodiments described above are obtained.

In the fifth to tenth embodiments, a description is given of a method of fabricating a DFD laser. The present invention can be applied to a semiconductor device other than a semiconductor laser device having a diffraction grating structure with the same effects as in the fifth to the tenth embodiments.

Embodiment 11

Figure 23:
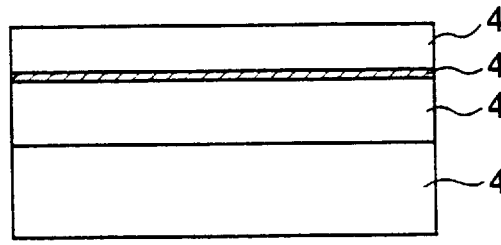
FIGS. 23(a)–23(d) are diagrams for explaining a method of fabricating a DFB laser according to an eleventh embodiment of the present invention.
Figure 23:
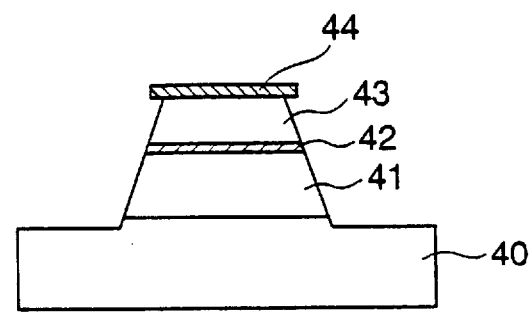
Figure 23:
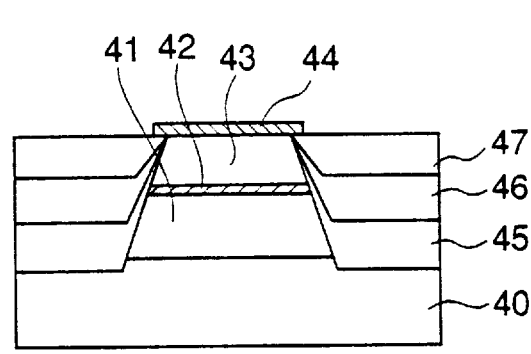
Figure 23:
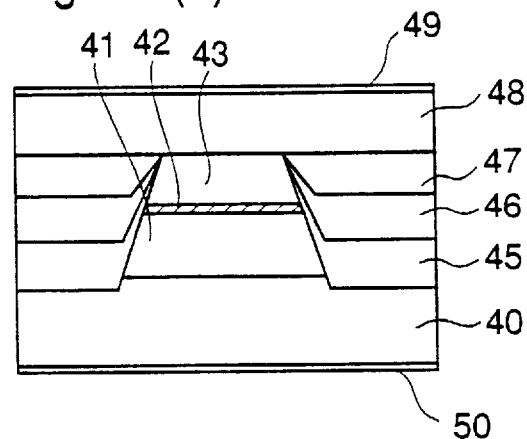

FIGS. 23(a)–23(d) are cross-sectional views illustrating a method of fabricating a DFB laser, using the thermal etching process in the first embodiment, according to an eleventh embodiment of the present invention. In the figures, reference numeral 40 designates a p type InP substrate, numeral 41 designates a p type InP cladding layer, numeral 42 designates an InGaAsP active layer, numeral 43 designates an n type InP cladding layer, numeral 44 designates an insulating film pattern comprising such as SiN, numerals 45 and 47 designate a first and a second p type InP current blocking layer, respectively, numeral 46 designates an n type InP current blocking layer, numeral 48 designates an n type InP contact layer, numeral 49 designates an n side electrode, and numeral 50 designates a p side electrode. As shown in FIG. 23(a), on a (100) just surface of the p type InP substrate 40, a double heterojunction structure comprising the p type InP cladding layer 41, the InGaAsP active layer 42, and the n type InP cladding layer 43 is grown.

Subsequently, as shown in FIG. 23(b), an insulating film is formed on the double heterojunction structure, and a stripe-shaped insulating film pattern 44 having a width of several $\mu$m and extending in the [0$\overline{1}\overline{1}$] direction is formed by photolithography. The thermal etching process described as the first embodiment is used to reach the InP substrate 40, thereby forming a ridge configuration having (111) planes for its side surfaces.

As shown in FIG. 23(c), with the ambient in the MOCVD apparatus being replaced by the ambient for crystal growth and the wafer not being exposed to air, and using the insulating film 44 as a mask, the p type InP current blocking layer 45, the n type current blocking layer 46, and the p type InP current blocking layer 47 are selectively formed to bury the ridge.

The wafer is taken out of the MOCVD apparatus, the insulating mask 44 of the wafer is removed, and the wafer is returned to the MOCVD apparatus, and, as shown in FIG. 23(d), the n type InP contact layer 48 is grown on the entire surface, and an n side electrode 49 and a p side electrode 50 are formed on the surface of the n type InP contact layer 48 and the rear surface of the substrate 40, respectively. Thereafter, the wafer is separated into semiconductor laser diode elements.

In this eleventh embodiment, by using the thermal etching of the first embodiment, the ridge can be formed with high controllability, and the semiconductor laser can be formed with high reproducibility. Further, since no etching solution is used, it is possible, after forming a ridge stripe by thermal etching in the MOCVD apparatus, to form a regrown layer to bury the ridge stripe without exposing the wafer to air, whereby contamination, such as the formation oxides, on the regrown interface is avoided and a semiconductor laser having superior characteristics is obtained.

Figure 24:
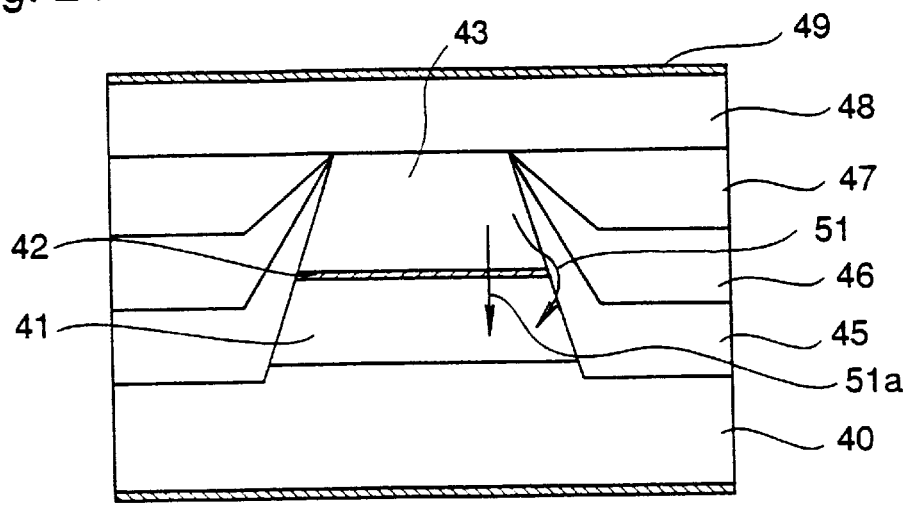
FIG. 24 is a diagram for explaining a leakage current path of a semiconductor laser according to an eleventh embodiment of the present invention.

While in the semiconductor laser of the eleventh embodiment, idle current flowing through the region other than the ridge portion is blocked by the three current blocking layers comprising the first p type InP blocking layer 45, the n type first InP blocking layer 46, and the p type second InP blocking layer 47, so current 51a flows through the ridge structure, there may be leakage current 51 flow through the n type InP cladding layer 43 and the first p type blocking layer 45 to the p type InP cladding layer 41a without flowing through the active layer 42, as shown in FIG. 24. In FIG. 24, the same reference numerals as in FIGS. 23(a)–23(d) designate the same elements. Because the leakage current significantly affects the characteristics of the laser diode, it is required to reduce the leakage current 51 by increasing the resistance of the p type InP blocking layer 45 in the vicinity of the active layer 42.

Figure 25:
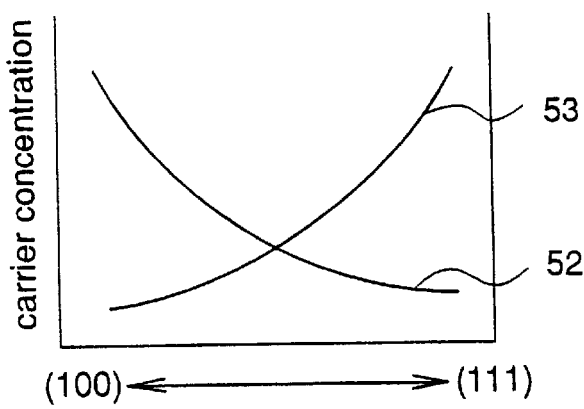
FIG. 25 illustrates a relation between doping efficiency and surface direction according to the eleventh embodiment of the present invention.

FIG. 25 shows a relationship between the dopant efficiency and the surface orientation when the flow rate of a source of dopant impurity is constant. As shown in this FIG. 25, the acceptors 52 and the donors 53 have doping efficiency dependencies in which the acceptors 52 have a decreasing efficiency from the (100) surface to (111) surface, and the donors 53 have an increasing efficiency from the (100) surface to (111) surface. Therefore, when acceptors and donors are supplied to the wafer having a (100) plane and a (111) inclined plane in growing InP, the inclined plane can take in a large quantity of donors relative to the (100) plane.

Figure 26:
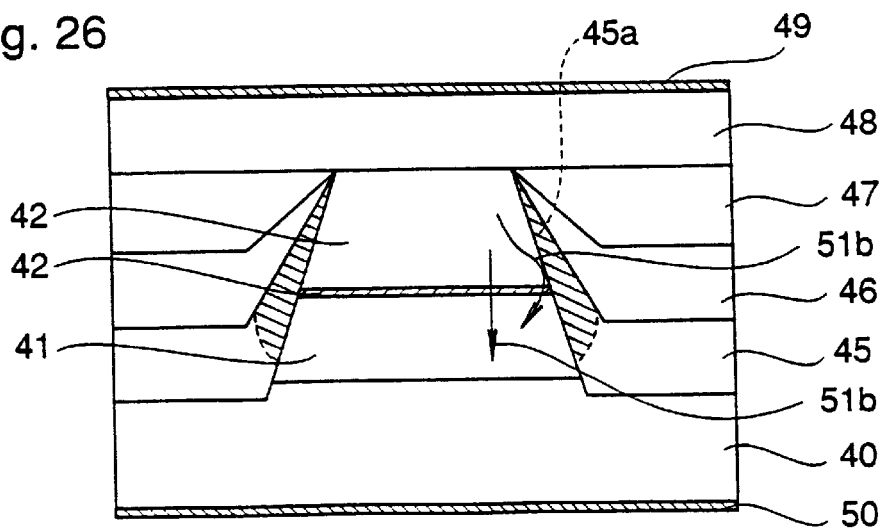
FIG. 26 is a diagram illustrating a structure of a semiconductor laser according to an alternative of the eleventh embodiment of the present invention.

Accordingly, when acceptors and donors are supplied during the growth of the p type InP blocking layer 45, a large quantity of dopant impurities are taken into the p type InP blocking layer 45 that is sloped at the ridge as shown in FIG. 26, and the concentration of donors compensates the p type conductivity and achieves a high resistivity, whereby a high resistance region 45a is obtained. As such dopant impurity sources, for example, DEZn or $H_2S$ may be supplied at the same time. As a result, what has been the leakage current 51 as shown in FIG. 24 can be made the current 51b contributing to the light emission because the current blocking of the high resistivity region 45a. Thereby, a semiconductor laser having high efficiency with suppressed leakage current 51 can be obtained. Previously, it has been necessary to adjust the quantity of donors supplied with the acceptors so that the sloped surface does not become n type.

While in the eleventh embodiment the blocking layer of the p type InP blocking layer 45, the n type InP blocking layer 46, and the p type InP blocking layer 47 are provided, a current blocking layer such as an Fe-doped InP or an AlInAs high resistivity layer lattice matching with the InP substrate 40, or layers not lattice matching the InP substrate 40 such as an AlGaInP layer or an AlGaAs layer, that can be used in ordinary laser diodes can be used as a current blocking layer with the same effects as in the eleventh embodiment.

While in this eleventh embodiment the ridge stripe direction is the [0$\overline{1}$1] direction, the present invention can be applied to cases where the ridge stripe direction is another direction such, as the [0$\overline{1}$1] direction, and the same effects as in the eleventh embodiment obtained.

Embodiment 12

FIGS. 27(a)–27(d) are cross-sectional views illustrating a method of fabricating a DFB laser, using thermal etching. This twelfth embodiment utilizes the thermal etching described as the first embodiment in a method of fabricating a semiconductor laser.

In the figures, reference numeral 54 designates an Fe doped InP (hereinafter referred to as Fe—InP) current blocking layer, reference numeral 55 designates an insulating film, and reference numeral 56 designates a mesa groove.

Figure 27:
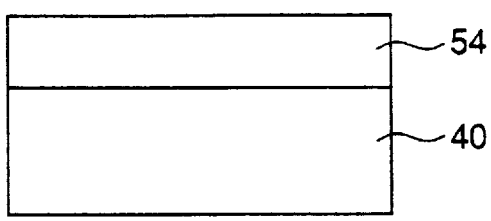
FIGS. 27(a)–27(d) is a cross-sectional view illustrating a method of fabricating a semiconductor laser according to a twelfth embodiment of the present invention.
Figure 27:
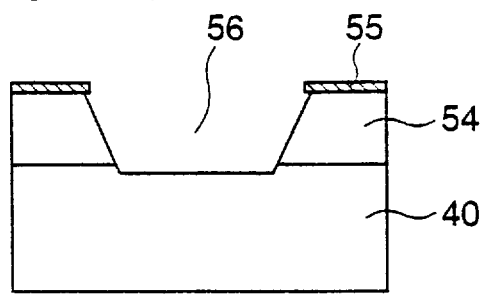
Figure 27:
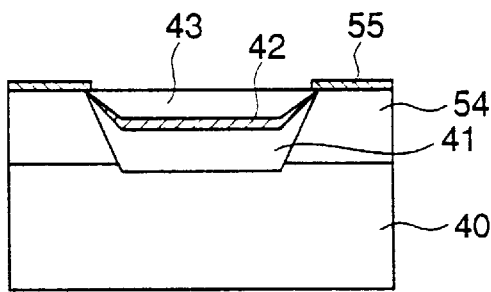
Figure 27:
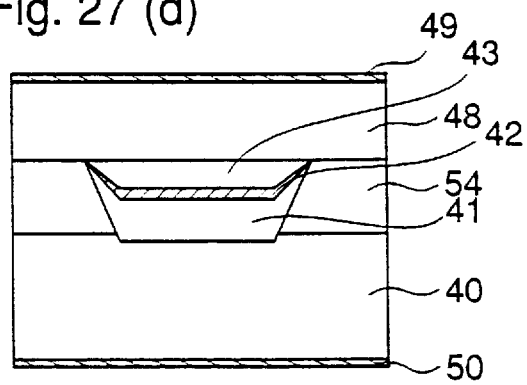

A description is given of the method of fabricating. As shown in FIG. 27(a), on a (100) just surface of a p type InP substrate 40, the Fe-doped InP blocking layer 54 is grown. Then, the p type InP buffer layer may be formed between the p type InP substrate 40 and the Fe-doped InP current blocking layer 54. Next, an insulating film 55 is formed on the current blocking layer 54, and a stripe-shaped aperture having a width of several $\mu$m, extending in the [0$\overline{1}$1] direction, is formed by photolithography.

As shown in FIG. 27(b), the Fe-doped InP layer 54 is etched to reach the p type InP substrate 40, using the thermal etching process and the insulating film 55 as a mask, in the MOCVD apparatus, thereby forming a groove 56 having a (111) B plane surface facet.

With the wafer not being exposed to air, a double heterojunction structure comprising the p type InP cladding layer 41, the active layer 42, and the n type InP cladding layer 43 is selectively regrown to bury the groove 56 (FIG. 27(c)).

After taking the wafer out of the MOCVD apparatus and removing the insulating mask 55, as shown in FIG. 27(d), the n type InP contact layer 48 is grown on the entire surface in the MOCVD apparatus, the n side electrode 49 and the p side electrode 50 are respectively formed on the surface of the contact layer 48 and the rear surface of the substrate 40, and then the wafer is separated into laser diode elements.

In the semiconductor laser of this twelfth embodiment, a double heterojunction structure is formed in the mesa groove 56. However, since, generally, semiconductor materials have a slower growth speed on a (111)B surface than on a (100) surface, the active layer 42 is hardly grown on the sloped surface in the mesa groove 56. Therefore, no laser light is emitted in the active layer 42 on the sloped surface, and laser oscillation occurs only in the active layer 42 which is in a plane parallel with the (100) plane.

In this embodiment, by using the thermal etching of the first embodiment, the mesa groove can be formed with high controllability and the semiconductor laser can be formed with high reproducibility. In addition, since no etching solution is employed and, after forming a mesa groove by thermal etching in the MOCVD apparatus, a double heterojunction structure can be selectively grown in the mesa groove without the wafer being exposed to air, the contamination, such as formation of oxide films, on the regrowth interface can be prevented, whereby a semiconductor laser device having superior characteristics is obtained.

Figure 28:
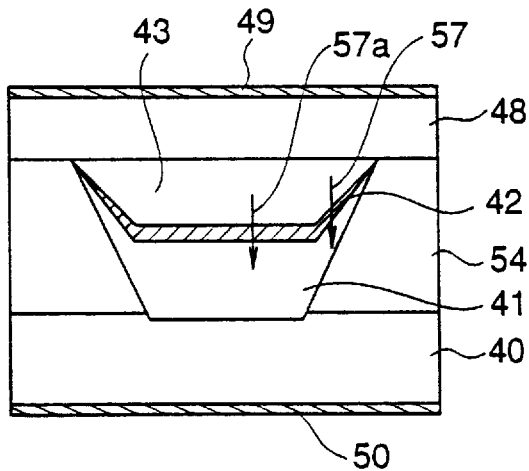
FIGS. 28(a) and 28(b) are diagrams illustrating a structure of a semiconductor laser according to an alternative of the twelfth embodiment of the present invention.
Figure 28:
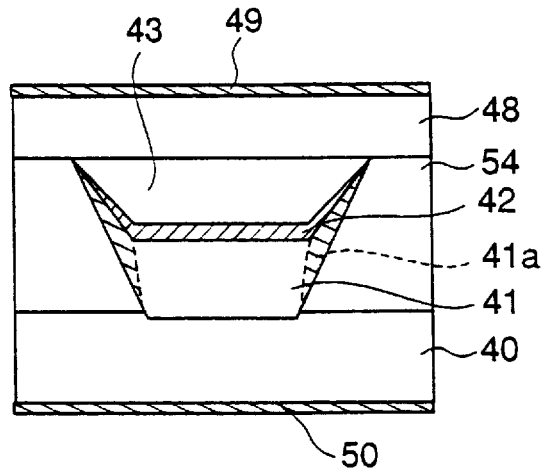

While in this twelfth embodiment, as shown in FIG. 28(a), since the double heterojunction structure is formed also on the sloped surface of (111)B plane as shown in FIG. 28(a), there is a possibility that a leakage current 57 will flow through the double heterojunction structure layer formed at the sloped surface of the (111)B plane of the mesa groove 56. The leakage current does not flow through the light emitting region, not contributing to the light emission line current 57a that flows through the active layer 42 on the (100) plane as the light emitting region. In order to block such leakage current 57, as described in the eleventh embodiment, acceptors and donors may be simultaneously supplied, to grow a p type InP cladding layer 41, to make the region 41a on the (111)B plane of the mesa groove 56 of the cladding layer 41, i.e., in the vicinity of the light emitting region of the active layer 42, high resistivity. In FIGS. 28(a)–28(b), the same reference numerals as those in FIGS. 27(a)–27(d) designate the same or corresponding elements.

Figure 29:
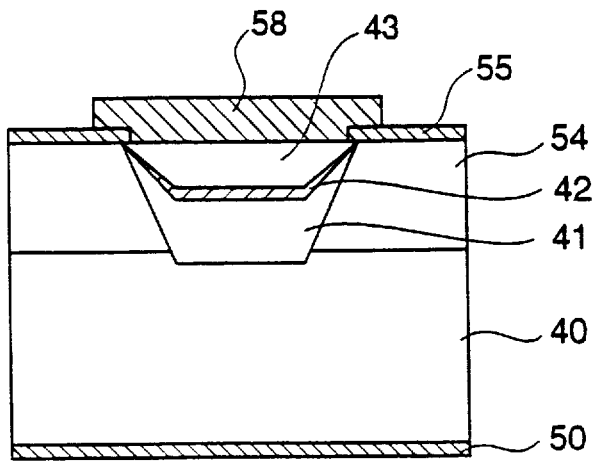
FIG. 29 is a diagram illustrating a structure of a semiconductor laser according to another alternative of the twelfth embodiment of the present invention.

In the twelfth embodiment, a double heterojunction structure is formed to bury the groove 56, the insulating film 55 is removed, and the contact layer 48 is provided, and further the n side electrode 49 is formed. In the present invention, however, it may be that after a double heterojunction structure is formed so as to bury the groove 56, an Au series electrode 58 is formed on the n type InP cladding layer 43 in the aperture of the insulating film 55 with the same effects in the twelfth embodiment. In FIG. 29, the same reference numerals as in FIG. 27(d) designate the same or corresponding elements. Numeral 58 designates an n side electrode.

In this embodiment, Fe—InP is employed as the material of the current blocking layer. Another high resistivity layer may be employed. In addition, as a structure of a current blocking layer, a laminated structure comprising p type blocking layer/n type InP layer/p type InP blocking layer may be used with the same effects as in the twelfth embodiment.

Embodiment 13

FIGS. 30(a)–30(d) are diagrams illustrating a method of fabricating a DFB laser according to a thirteenth embodiment of the present invention. In the figures, the same reference numerals as in FIGS. 5(a), 5(b), and 27(a)–27(d) designate the same or corresponding elements.

Figure 30:
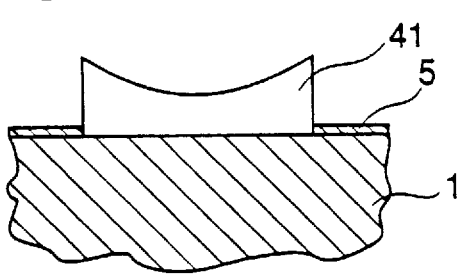
FIGS. 30(a)–30(d) are diagrams for explaining a method of fabricating a semiconductor laser according to a thirteenth embodiment of the present invention.
Figure 30:
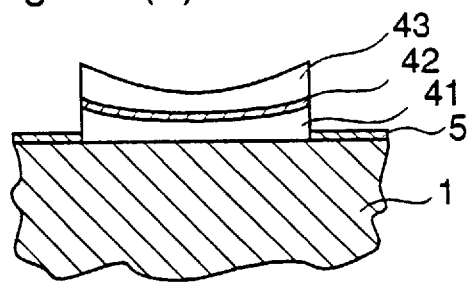
Figure 30:
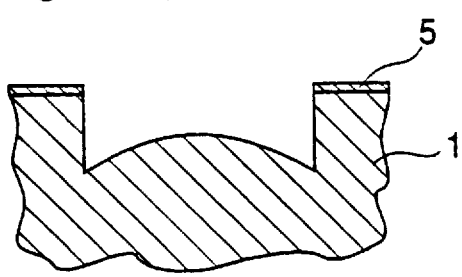
Figure 30:
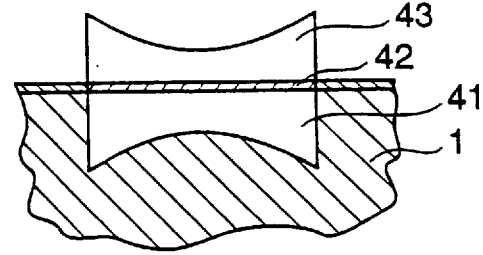

As shown in FIG. 30(a), using the insulating film mask 5 having an aperture of a predetermined width on the InP substrate 1 as a mask, the InP cladding layer 41 is selectively grown on the InP substrate 1, resulting in a growth speed higher in the vicinity of the mask due to the concentration gradient of the material in the vapor phase. Accordingly, a selective growth of a double heterojunction structure comprising the p type InP cladding layer 41, the active layer 42, and the n type InP cladding layer 43 of the laser diode is selectively grown using the mask 5, the structure of FIG. 30(c) is obtained. The active layer 42 is concave upward in the vicinity of the mask. For example, when a semiconductor laser is formed using such a double heterojunction structure so that the width direction of the mask is the resonator length direction, a semiconductor laser having a structure in which the active layer is curved in the vicinity of the resonator facet is obtained, thereby deteriorating the laser characteristics.

On the other hand, using selective etching of the InP substrate 1 by the process of the first embodiment, the etching speed in the vicinity of the mask becomes high as shown in FIG. 5(a). Accordingly, in this thirteenth embodiment, using the thermal etching described as the first embodiment, the (100) surface of the InP substrate 1 is etched using the mask 5 (FIG. 30(c)), and the p type InP cladding layer 41 is formed in this etched groove. The growth speed of the p type InP cladding layer 41 is higher closer to the mask 5, and the groove formed by the thermal etching is deeper closer to the mask 5, whereby the surface of the p type InP cladding layer 41 is approximately flat at the surface of the InP substrate 1. In addition, after the surface of the p type InP cladding layer 41 is made approximately flat, the active layer 42 is formed, and the n type InP cladding layer 43 is grown.

According to this method of fabricating a semiconductor laser, a mesa groove is formed by using the thermal etching, and then a double heterojunction structure is selectively grown in the mesa groove, whereby the active layer is parallel to the substrate surface.

Embodiment 14

Figure 31:
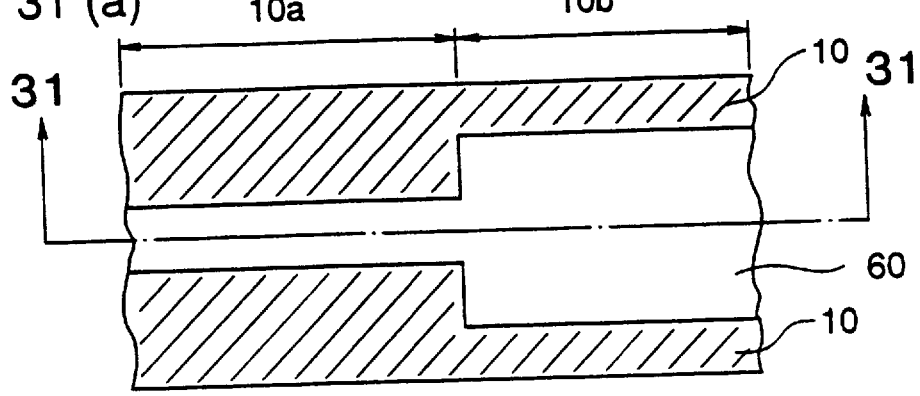
FIGS. 31(a)–31(d) are diagrams for explaining a method of fabricating an integrated semiconductor laser and light modulator according to a fourteenth eleventh embodiment of the present invention.
Figure 31:
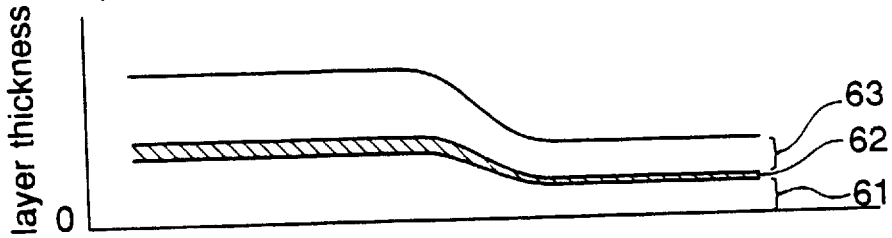
Figure 31:
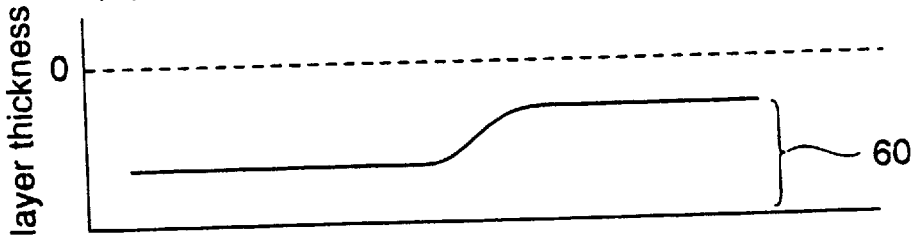
Figure 31:
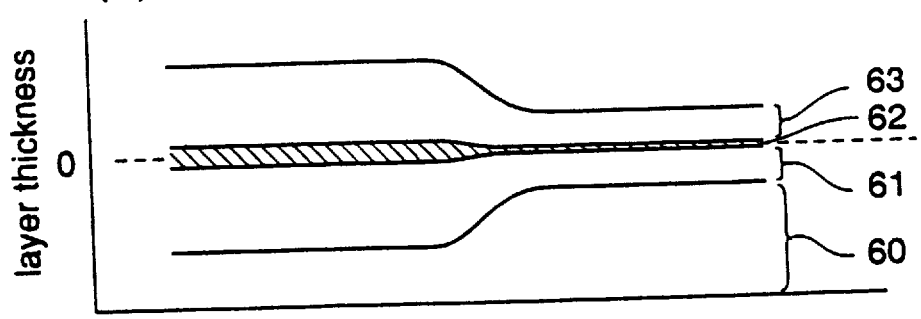

FIGS. 31(a)–31(d) are diagrams illustrating a method of fabricating a semiconductor laser provided with a light modulator according to a fourteenth embodiment of the present invention. In the figures, the same reference numerals as in FIGS. 32(a)–32(d) designate the same or corresponding elements. Reference numeral 60 designates a p type InP substrate. Numeral 61 designates a p type InP cladding layer. Numeral 62 designates an active layer of a quantum well structure with laminated alternating well layers and barrier layers which comprise $In_xGa_{1-x}As_yP_{1-y}$. Numeral 63 designates an n type InP cladding layer. Here, figure 31(a) is a plan view illustrating an insulating film pattern 10 viewed from the InP substrate 60, FIGS. 31(b)–31(d) are cross-sectional views along line 31—31 of FIG. 31(a), respectively. In the FIGS. 31(b)–31(d), the abscissa represents the position on the substrate 60, and the ordinate represents the layer thickness relative to the surface of the substrate 60.

Figure 32:
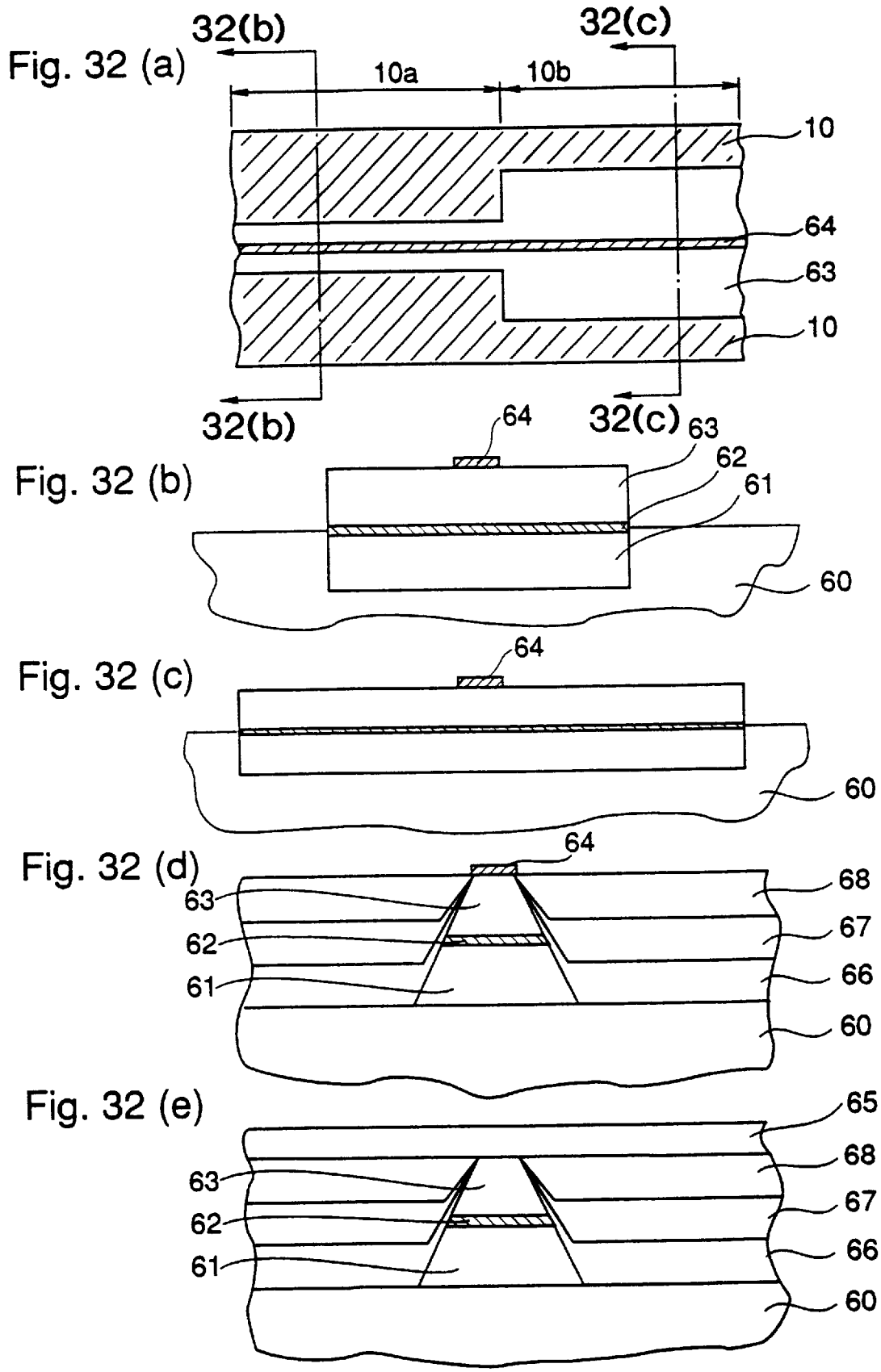
FIGS. 32(a)–32(e) are diagrams for explaining a method of fabricating an integrated semiconductor laser and light modulator according to the fourteenth embodiment of the present invention.

FIGS. 32(a)–32(e) are a plan view (FIG. 32(a)) of the substrate 60 illustrating a method of fabricating a semiconductor laser provided with a light modulator according to a fourteenth embodiment of the present invention, cross-sections of FIG. 32(a) along line 32c—32c (FIGS. 32(b), 32(d), and 32(e)), and a cross-section along line 32—32 (FIG. 32(c)), respectively. In the figures, the same reference numerals designate the same or corresponding elements as those of FIGS. 31(a)–31(d). Reference numeral 64 designates a stripe-shaped insulating film, numeral 65 designates an n type InP contact layer, numerals 66 and 68 designate first and second n type InP current blocking layers, respectively, and numeral 67 designates a p type InP current blocking layer.

A description is given of a method of fabricating a semiconductor laser provided with light modulator with reference to FIGS. 31(a)–31(d). The prior art semiconductor laser (LD) with light modulator integrates an LD portion and a light modulator portion monolithically, utilizing the difference in the selective growth speed due to a difference in the width of the aperture of the insulating film pattern. First of all, on the p type InP substrate 60, an insulating film pattern 10 having a stripe-shaped aperture extending in the length direction of the substrate 60 as shown in FIG. 31(a) is formed. This pattern is divided into a semiconductor laser region 10a and a light modulator region 10b in the length direction of the substrate 60. Apertures are formed such that the aperture in the light modulator region 10b is larger than that in the semiconductor laser region 10a. For example, the width of the aperture in the semiconductor laser region 10a is set to about 50 æm and the width of the aperture in the light modulator region 10b is set to about 100 μm, respectively.

Subsequently, using this insulating film pattern 10 as a mask, the p type InP cladding layer 61, the quantum well structure active layer 62 comprising InGaAsP, and the n type InP cladding layer 6 are successively grown. At the portion having a wide aperture width in the insulating film pattern 10, the growth speed is slower than that at a portion having a narrow aperture, so the crystal growth speed of the light modulator region 10b is slower than that of the semiconductor laser region 10a. The thickness of the respective layers of the light modulator region are thinner than those of the respective layers in the semiconductor laser region as shown in FIG. 31(b). Furthermore, a contact layer (not shown) is formed on the n type InP cladding layer 63, an electrode is formed on the rear surface of the semiconductor substrate 60, and independent electrodes are formed on the contact layer in the semiconductor laser region 10a and the light modulator region 10b, respectively, whereby a semiconductor laser with light modulator (not shown) is obtained.

A description is given of the operation of the prior art semiconductor laser with light modulator. In the prior art semiconductor laser with light modulator, the thickness of the quantum well active layer 62 in the semiconductor laser region 10a is thicker than that of the active layer 62 of the light modulator region 10b. Thus, the energy band gap of the active layer 62 in the light modulator region 10b is larger than the energy band gap of the active layer 62 in the semiconductor layer region 10a. Accordingly, the laser light generated in the active layer 62 of the semiconductor laser region 10a propagates into the light modulator region 10b and, by applying a voltage to the electrode of the light modulator region 10b, the band gap energy of the active layer 62 in the light modulator region 10b becomes larger or smaller than the band gap energy of the active layer 62 in the semiconductor laser region 10a. Thus, the light generated at the active layer 10a of the semiconductor laser region 10a is cut off and not output in the light modulator region 10b, thereby generating a modulated light signal.

In the prior art semiconductor laser with light modulator, by varying the crystal growth speed using the insulating film pattern 10, the p type InP cladding layer 61, the InGaAsP quantum well active layer 62, and the n type InP cladding layer 63 are successively formed on the substrate 60 to vary the thickness of the quantum well active layer 62. Therefore, there arises a positional deviation in the height direction of the active layer 62 between the semiconductor laser region 10a and the light modulator region 10b, blocking the propagation of the laser light. Thus, the propagation characteristics of the laser light between the active layer 62 in the semiconductor laser region 10a and the active layer 62 in the light modulator region 10b cannot be significantly improved.

A description is given of a method of fabricating a semiconductor laser according to a fourteenth embodiment of the present invention, which solves these problems. As shown in FIG. 31(a), an insulating film pattern 10 having a stripe-shaped aperture extending in the length direction of the substrate 60 is formed on the substrate 60. This insulating film pattern 10 is separated into the semiconductor laser region 10a and the light modulator region 10b. The widths of the apertures are adjusted so that in the light modulator region 10b the aperture is wider than that in the semiconductor laser region 10a, For example, the width of the aperture in the semiconductor laser region 10a is set to about 50 μm, and the width of the aperture in the light modulator region 10b is set to about several hundreds of μm.

Next, using the insulating film pattern 10 as a mask, the InP substrate 60 is thermally etched by the thermal etching process described as the first embodiment. When the etching is performed in this way, the substrate 60 is etched so that the depth is shallow in the light modulator region 10b having a wide aperture in the insulating film 10 and the etched depth is deep in the semiconductor laser region 10a having a narrow aperture in the insulating film 10 (FIG. 31(c)).

On the etched substrate 60, using the insulating film pattern 10 as a selective mask, the p type InP cladding layer 61 is formed to approximately fill the region removed by the etching, and then the InGaAsP quantum well active layer 62 and the n type InP cladding layer 63 are selectively regrown. As described above, in the selective growth, the growth speed is slower where the insulating film pattern has a large aperture, and the respective layers formed on the light modulator region 10b are thinner than the thicknesses of respective layers formed at the semiconductor laser region 10a. However, the etched depth in the light modulator region 10b is shallower than the etched depth of the semiconductor layer region 10a as shown in FIG. 31(c). Therefore, when the quantum well active layer 62 is grown after forming the p type InP cladding layer 61, to a position close to the surface of the substrate 60, as shown in FIG. 31(d), the active layer 62 of the semiconductor laser region 10a and the active layer 62 of the light modulator region 10b can be formed at heights approximately equal to each other.

Furthermore, as shown in FIG. 32(a), on the n type InP cladding layer 63 formed in the aperture of the insulating film 10, a stripe-shaped insulating film mask 64 having a width of several μm extending in the length direction of the substrate 1, is formed by photolithography. FIG. 32(b) and FIG. 32(c) show cross sections at that time, respectively. Using this insulating film mask 64 as a mask, the thermal etching process described as the first embodiment is performed to reach the substrate 60, thereby forming a mesa stripe. The ambient in the MOCVD apparatus is replaced by the ambient for selective growth, and the first n type InP current blocking layer 66, the p type InP current blocking layer 67, and the second n type InP current blocking layer 68 are formed, burying the mesa stripe. The cross-section of the semiconductor laser region 10a then is as shown in FIG. 32(d).

The wafer is taken out of the MOCVD apparatus, the insulating film 64 is removed, and, as shown in FIG. 32(e), the InP contact layer 65 is formed. Further, a p side electrode (not shown) is formed on the rear surface of the semiconductor substrate 60, and electrodes (not shown) are respectively formed on the surfaces of the contact layer 65 of the semiconductor laser region 10a and the light modulator region 10b, respectively, thereby forming a semiconductor laser with a light modulator.

In the method of fabricating the semiconductor device according to the fourteenth embodiment of the present invention, since performing the thermal etching of the substrate 60 using the insulating film 10 provided with an aperture having different stripe widths as a mask, a double heterojunction structure is selectively grown using the insulating film mask 10 to form a semiconductor laser with light modulator. The active layer 62 that is formed in the region 10a is thicker than the active layer 62 in the light modulator region 10b and the heights of the active layers of the semiconductor laser region 10a and of the light modulator region 10b are the same. Thus, a semiconductor laser with a light modulator superior in the propagation of laser light between the quantum well active layer 62 in the semiconductor laser region 10a and the quantum well active layer 62 in the light modulator region 10b is obtained.

In the fourteenth embodiment the formation of the mesa may be performed by wet etching used in the usual method of fabricating a semiconductor laser. The current blocking layer may be any structure or of any material that can be used in the usual semiconductor laser.

In the eleventh to fourteenth embodiments, a description is given of a semiconductor laser. However, the present invention may be applied to any semiconductor device and the same effects as in the respective embodiments are obtained.

Embodiment 15

Figure 33:
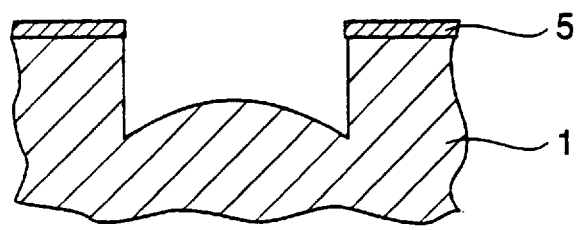
FIGS. 33(a)–33(b) are diagrams for explaining an etching method for a semiconductor according to a fifteenth embodiment of the present invention.
Figure 33:
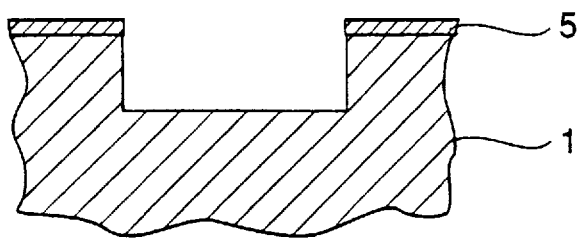

FIGS. 33(a) and 33(b) are diagrams illustrating a semiconductor etching method according to a fifteenth embodiment of the present invention. In the figures, the same reference numerals used in FIGS. 5(a) and 5(b) designate the same or corresponding elements. The etching method of this embodiment includes In supplied by adding an organic metal compound such as TMI (trimethylindium), during the thermal etching described as the first embodiment.

In the thermal etching described as the first embodiment, the etching rate in the vicinity of the mask 5 becomes faster, and when the configuration in the depth direction of the InP substrate 1 after the etching was investigated, the cross-sectional configuration is deeper in the vicinity of the mask 5 and shallower in a portion spaced from the mask. However, by supplying In as an organic metal compound, such as TMI, during the thermal etching of the first embodiment, the etching speed in the vicinity of the mask 5 is slower and the etched bottom surface can be flat as shown in FIG. 33(b). The In atoms formed by decomposition of the TMI diffuse into the vapor phase and are supplied to the vicinity of the mask. By adding In, the etched surface can be made cleaner. In FIGS. 33(a) and 33(b), although the cross-section of the side surface of the etched groove is schematically illustrated as perpendicular to the surface of the substrate 1, the side surface of the etched groove is actually a sloped surface.

According to this embodiment, by adjusting the amount of In added in the thermal etching process of the first embodiment, the etching speed difference in the width direction of an aperture of a mask is controlled, resulting in a groove having a flat etched bottom surface. In addition, by adding In, the etching surface is clean.

In the fifteenth embodiment, the present invention is applied to the thermal etching process in the first embodiment. The present invention can be applied to the vapor phase etching using a halogen series gas. For example, In can be added in vapor etching using Hcl gas with the same effects as in the fifteenth embodiment.

Embodiment 16

FIGS. 34(a)–34(d) are diagrams illustrating an array type semiconductor laser (hereinafter referred to as array laser) according to a sixteenth embodiment of the present invention. In the figures, the same reference numerals shown in FIG. 27(d) designate the same or corresponding elements. Reference numeral 70 designates an insulating film.

In the array laser of this sixteenth embodiment, an array type semiconductor laser is fabricated according to the method of fabricating the twelfth embodiment. Particularly, an Fe—InP current blocking layer 54 is formed on the substrate 40, an insulating film 55 having stripe-shaped parallel apertures arranged with a predetermined interval are formed on the surface, and the thermal etching process described as the first embodiment etches from the surface of the Fe—InP blocking layer to the substrate 40, in the MOCVD apparatus. Then, the ambient in the MOCVD apparatus is replaced by the ambient for crystal growth without the wafer being exposed to air, and the p type InP cladding layer 41, the InGaAsP active layer 42, and the n type InP contact layer 43 are selectively grown. Thereafter, the insulating film is removed and the n type InP contact layer 48 is formed on the entire surface, an n side electrode 49 and a p side electrode 50 are respectively formed on the contact layer 48 and the rear surface of the substrate 1, whereby a laser array with a plurality of laser elements on the substrate 40 as shown in FIG. 34(a) is obtained with the same effects as in the twelfth embodiment.

In the sixteenth embodiment, the contact layer 48 and the n side electrode 49 of the array laser are integrated with each other without being separated into respective laser elements. As shown in FIG. 34(b), after forming the contact layer 48 as in the sixteenth embodiment, a stripe-shaped groove reaching the insulating film 54 is formed in the contact layer 48 on the insulating film 54, and the insulating film 70, such as SION, is formed so as to fill the groove, thereby providing the contact layers 48 for respective laser elements. The n side electrode 49 is provided on the contact layer 48 at an opening in the insulating film 70. In this case, n side electrodes 49 dependent for laser elements are formed, so it is possible to control the respective laser elements independently.

Figure 34:
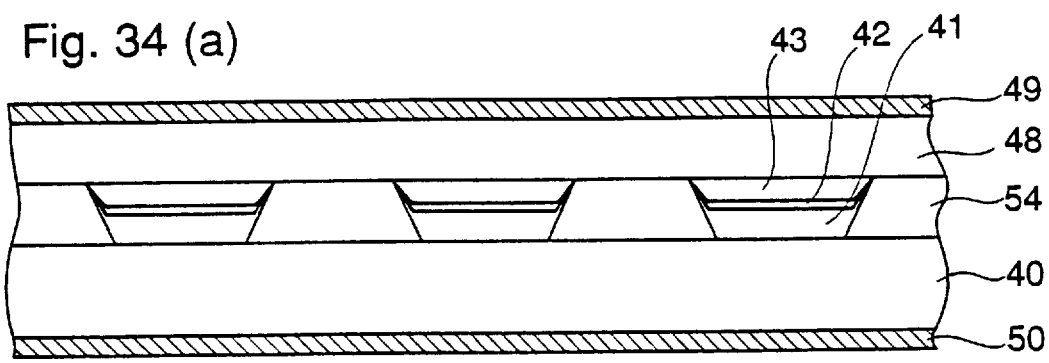
FIGS. 34(a)–34(d) are diagrams for explaining a method of fabricating a semiconductor laser array according to a sixteenth embodiment of the present invention.
Figure 34:
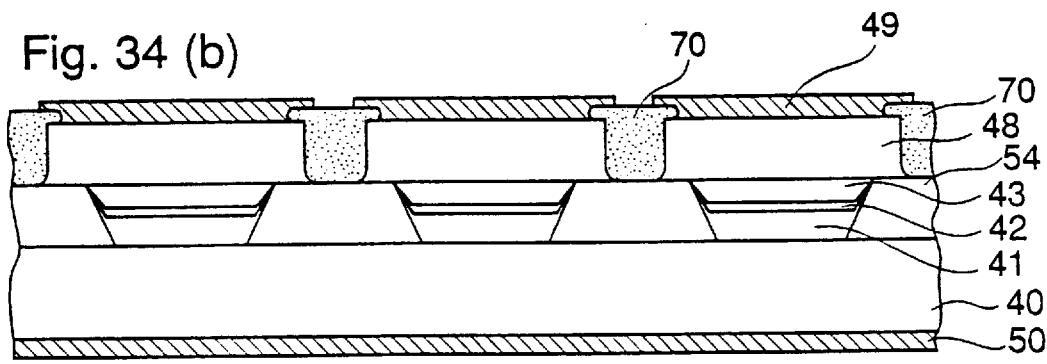
Figure 34:
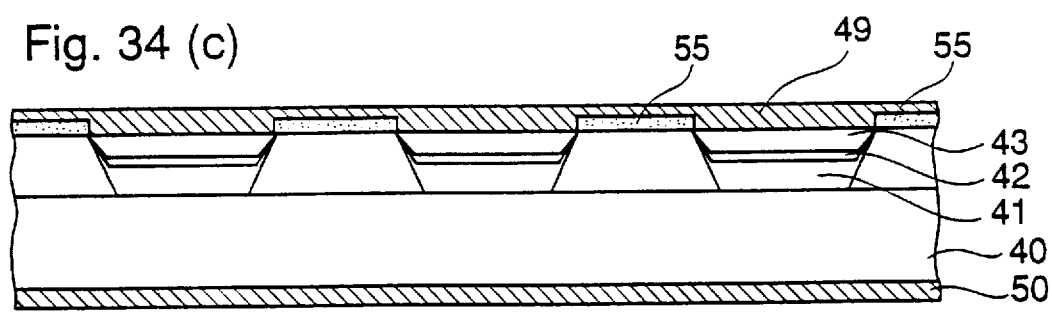
Figure 34:
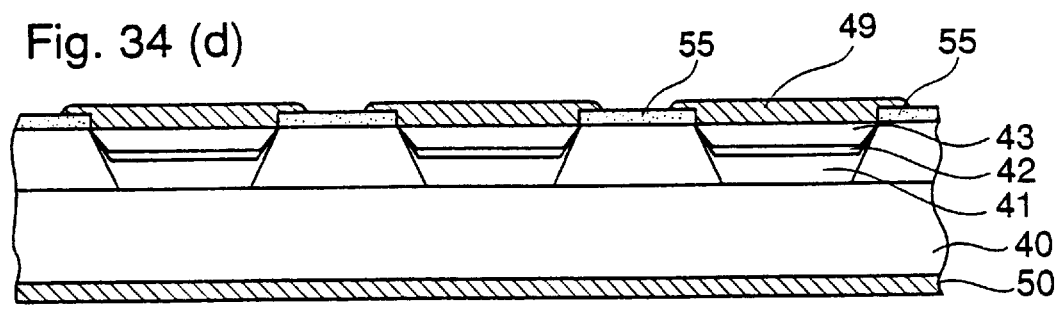

In addition, in the sixteenth embodiment, after selectively growing the n type InP cladding layer 43, the n side electrode 49 may be formed on the entire surface, without removing the insulating film 55 used for the selective growth, thereby resulting in an array laser having the structure shown in FIG. 34(c).

In addition, in the sixteenth embodiment, after selectively growing the n type InP cladding layer 43, the n side electrode 49 may be formed to bury the aperture of the insulating film 55, thereby forming the array laser of the structure shown in FIG. 34(d), with the same effects as in the sixteenth embodiment and respective laser elements can be controlled independently.

In the sixteenth embodiment, an array type laser is formed using the method of fabricating described as the twelfth embodiment. A description is given of an alternative in which an array type semiconductor laser is formed using the fabricating method described as the eleventh embodiment.

FIGS. 35(a)–35(d) are diagrams for illustrating alternatives of the sixteenth embodiment in which the same reference numerals as in FIGS. 23(d) and 34(a)–34(d) designate the same or corresponding elements.

Figure 35:
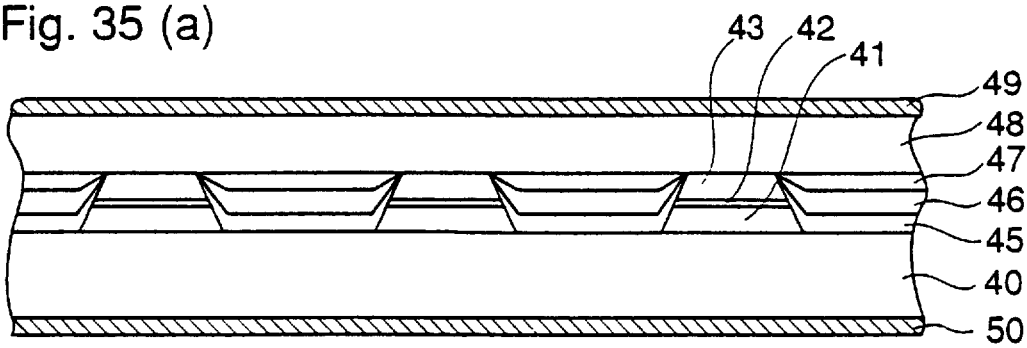
FIGS. 35(a)–35(d) are diagrams for explaining a method of fabricating a semiconductor laser array according to an alternative of the sixteenth embodiment of the present invention.
Figure 35:
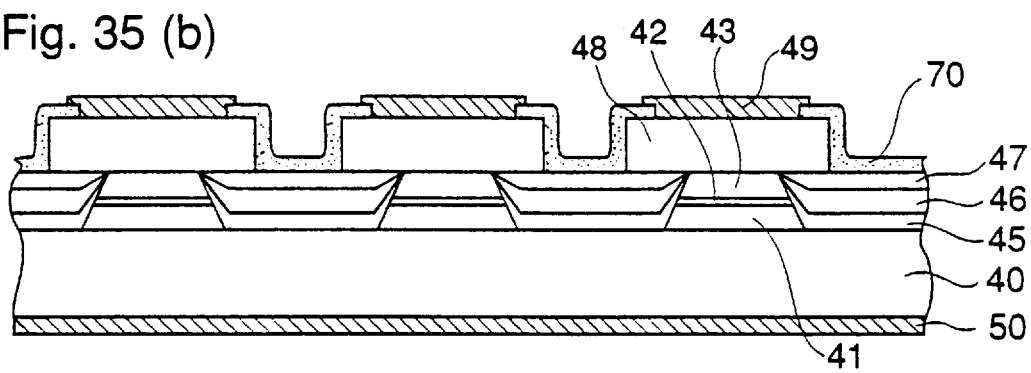
Figure 35:
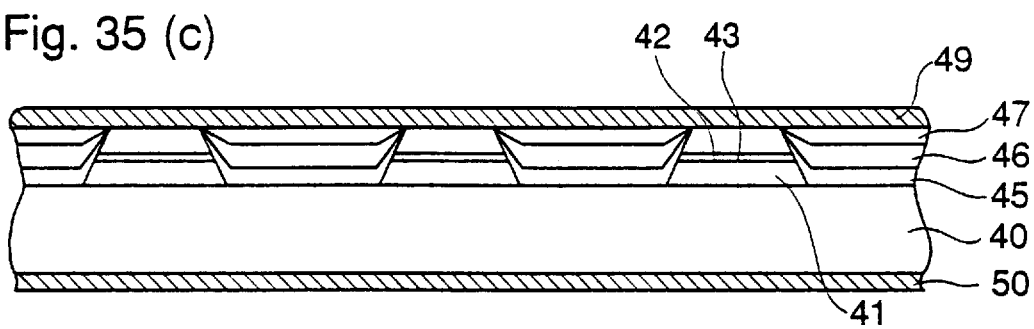
Figure 35:
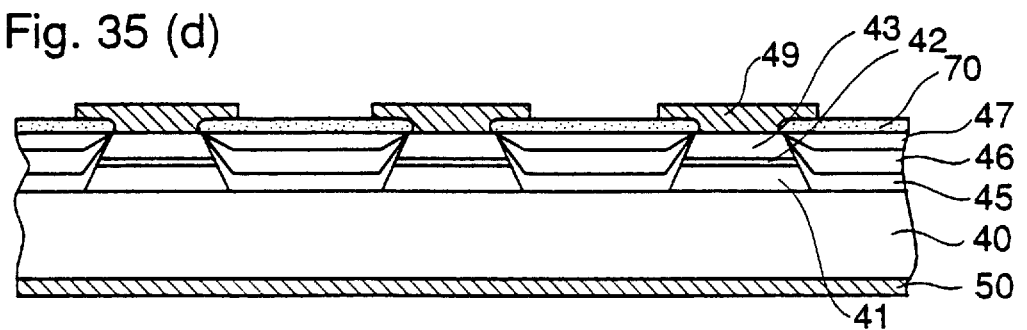

The array laser shown in FIG. 35(a) includes the semiconductor lasers described in the twelfth embodiment, in an array, and, after forming the p type InP cladding layer 41, the active layer 42, and the n type InP cladding layer 43, a plurality of parallel stripe-shaped insulating films extending in the resonator length direction with predetermined intervals are formed on the n type InP cladding layer 43. Thereafter, the same fabricating method as the eleventh embodiment is used, with the same effects as in the eleventh embodiment.

As another alternative of this sixteenth embodiment, as shown in FIG. 35(b), after forming the contact layer 48 as in the sixteenth embodiment, a stripe-shaped groove reaching the second p type InP blocking layer 47 is formed, an insulating film 70 is formed so as to fill the groove, and an n side electrode 49 is formed on the contact layer 48 at openings in the insulating film 70. In this case, the respective laser elements can be controlled independently.

As still another alternative of this sixteenth embodiment, the n side electrode 49 may be formed on the second p type InP blocking layers 47 and the ridge stripe without providing the contact layer 48, thereby forming an array laser having a structure as shown in FIG. 35(c).

As yet another alternative of this sixteenth embodiment, after selectively growing the second p type InP blocking layer 47, the stripe-shaped insulating film mask used for forming a ridge is removed, the insulating film 70 is formed on the second current blocking layer 47, and the n side electrode 49 is formed to fill the aperture of the insulating film 70, thereby forming an array laser having a structure as shown in FIG. 35(d).

Embodiment 17

FIGS. 36(a)–36(d) are diagrams for illustrating a method of fabricating an array type laser according to a seventeenth embodiment of the present invention. The array laser of this embodiment includes laser elements producing light of different wavelengths, and it is fabricated by a method similar to the sixteenth embodiment.

In the figures, the same reference numerals as in FIGS. 27(a)–27(d) designate the same or corresponding elements. Numeral 42a designates an active layer having a multi-quantum well structure of well layers and barrier layers both comprising $In_xGa_{1-x}As_yP_{1-y}$ layers. Numerals 54a, 54b, and 54c designate portions of a plurality of apertures in the insulating film 55 and having different widths, where the aperture 54a is narrowest and the aperture 54b is widest.

Figure 36:
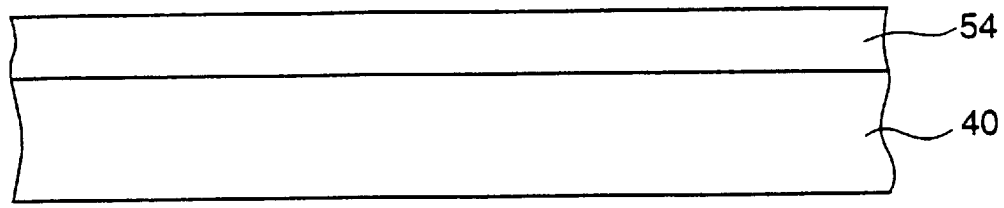
FIGS. 36(a)–36(d) are diagrams for explaining a method of fabricating a semiconductor laser array according to a seventeenth embodiment of the present invention.
Figure 36:
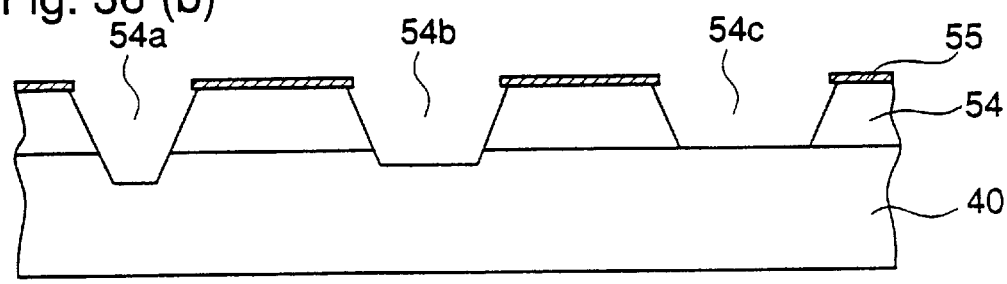
Figure 36:
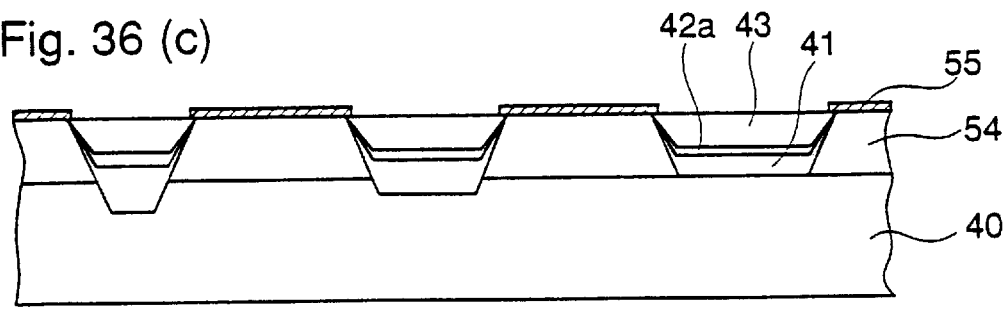
Figure 36:
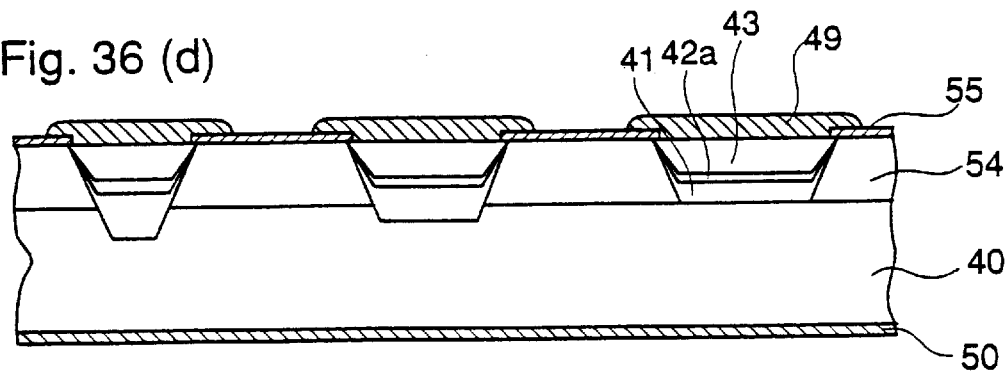

A description is given of the operation. As shown in FIG. 36(a), an Fe—In current blocking layer 54 is formed on the InP substrate 40, and an insulating film mask 55 having a plurality of stripe-shaped apertures extending in the [0$\bar{1}\bar{1}$] direction and having different widths is formed.

Using the insulating film 55 as a mask, the current blocking layer 54 is etched by the thermal etching process described as the first embodiment, to reach the InP substrate 40. Then, as described in the first embodiment using FIGS. 4(a) and 4(b) because, as the aperture width of the mask becomes narrower, the etching depth becomes deeper, the depth of the mesa groove in the aperture 54a is the deepest, and the depth of the mesa groove in the aperture 54c is the shallowest.

As shown in FIG. 36(c), the p type InP cladding layer 41, the multi-quantum well active layer 42a, and the n type InP cladding layer 43 are formed to fill the mesa groove formed by the etching. When the crystal growth is performed by MOCVD, the growth speed in a wide aperture is slow and in a narrow aperture is fast. Therefore, the crystal growth speed in the mesa groove formed by thermal etching at the shallow etching depth in a wide aperture is slow while that at the deep etching depth in a narrow aperture is fast. In the apertures 54a, 54b, and 54c, the growth speed in the aperture 54a is the fastest, and the growth speed in the aperture 54c is the slowest. As a result, the position of the active layer 42a in respective apertures relative to the surface of the substrate 1 become approximately the same. Accordingly, in the apertures 54a, 54b, and 54c, the thickness of the quantum well active layer 42 in the aperture 54a is the thickest and the thickness of the quantum well active layer 42 in the aperture 54c is the thinnest.

Thereafter, as shown in FIG. 36(d), an n side electrode 49 is formed in the aperture of the insulating film mask 55, and a p side electrode 50 is formed on the rear surface of the substrate 1, thereby producing an array laser.

In the array laser of this embodiment, the thicknesses of the well layers and the barrier layers of the multi-quantum well active layer 42a of the respective laser elements depends on the widths of the apertures in the insulating film 55. Therefore, the wavelengths of the laser light emitted from the respective laser elements are different.

In this way, in the array laser of this embodiment, the thermal etching is performed using a mask having an aperture with different widths and, thereafter, a double heterojunction structure is formed by crystal regrowth. Thus, a laser element with a quantum well active layer having different thicknesses due to different widths in the insulating film mask can be simultaneously formed, and the fabrication process of a laser array that can emit laser light of different wavelengths is shortened.

Embodiment 18

FIGS. 37(a)–37(g) are cross-sectional views illustrating a method of fabricating an array laser with a light modulator according to an eighteenth embodiment of the present invention. The array laser provided with the light modulator of this eighteenth embodiment has a plurality of semiconductor laser devices each with a light modulator and producing different wavelengths of light. These laser devices are fabricated by the same methods as the method of the sixteenth embodiment. In the FIGS. 37(a)–37(g), the same reference numerals as in FIGS. 32(a)–32(e) designate the same or corresponding elements. Reference numeral 62a designates a multi-quantum well active layer with barrier layers and well layers each comprising $In_xGa_{1-x}As_yP_{1-y}$, and reference numeral 73 designates an n side electrode comprising an Au series material located at the semiconductor laser region. Reference numeral 54 designates an Fe—InP current blocking layer, and reference numeral 70 designates an insulating film comprising such as SiON.

A description is given of the fabricating method. First of all, an insulating film mask 10 having a plurality of stripe-shaped patterns with a narrow width aperture in the semiconductor laser region and a wide width aperture in the light modulator region is formed. The apertures are parallel to each other. Then, the aperture patterns are formed so that the widths of the apertures in the semiconductor laser regions are different from each other.

Figure 37:
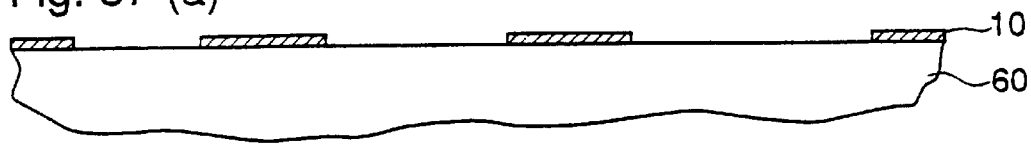
FIGS. 37(a)–37(g) are diagrams for explaining a method of fabricating an integrated semiconductor laser and light modulator according to an eighteenth embodiment of the present invention.
Figure 37:
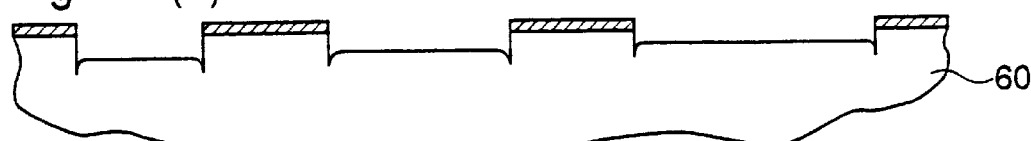
Figure 37:
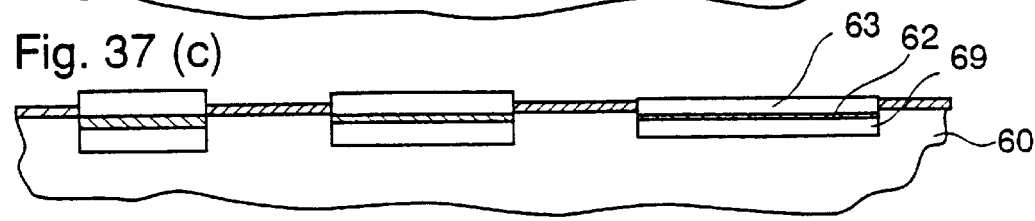
Figure 37:
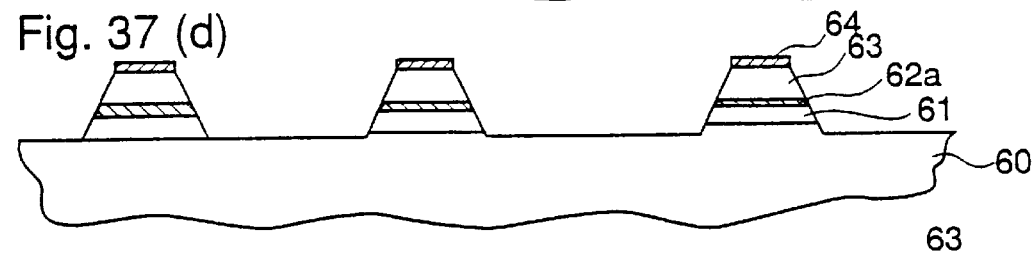
Figure 37:
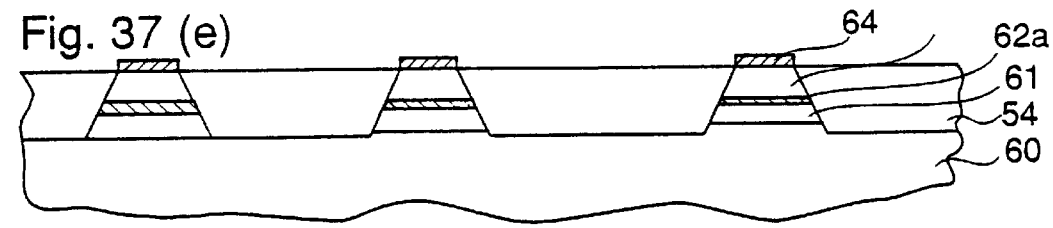
Figure 37:
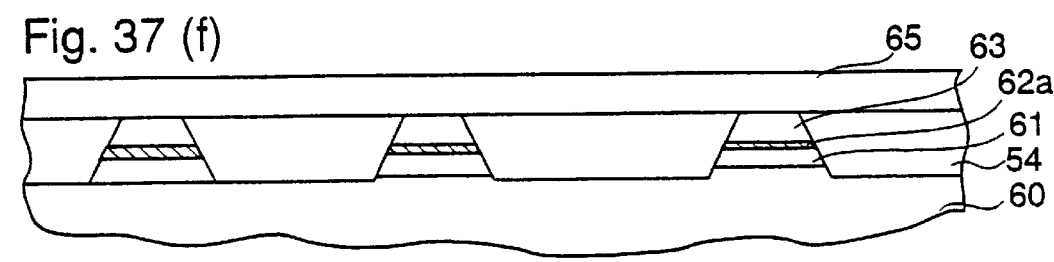
Figure 37:
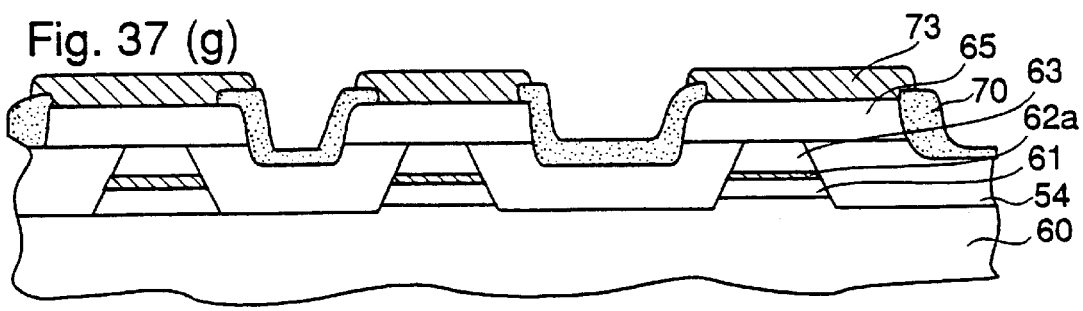

After thermal etching of the substrate 1 using the insulating film 10 as a mask, as in the fourteenth embodiment (FIG. 37(b)), the p type InP cladding layer 61, the quantum well active layer 62a, and the n type InP cladding layer 63 are formed. The cross-section in the resonator length direction of the semiconductor laser region is similar to the cross-section as shown in FIG. 31(d). In the cross-section in the resonator width direction of the semiconductor laser region, the thicknesses of the well layers and the barrier layers of the active layer 62a formed in a narrow aperture are thick and the thicknesses of the well layers and the barrier layers of the active layer 62a in the wide aperture are thin.

As in the fourteenth embodiment, after removal of the insulating film 10, the stripe-shaped insulating film 64 is formed, and thermal etching or wet etching is performed to reach the substrate 1, using the insulating mask as a mask. As shown in FIG. 37(d), a mesa stripe is formed, a Fe—InP current blocking layer 54 is formed to bury the mesa stripe, the insulating film 64 is removed, and the n type InP contact layer 65 is formed on the blocking layer 54 and on the n type InP cladding layer 63.

Thereafter, the contact layer 65 between the respective mesa stripes is etched and removed to reach the blocking layer 54, forming grooves, and an insulating film 70 is formed to fill the grooves, thereby separating the contact layer 65 into parts corresponding to respective mesa stripes. Thereafter, a p side electrode (not shown) is formed on the rear surface of the substrate 1, an electrode 73 is formed on the surface of the contact layer 65 at the semiconductor laser region and an electrode (not shown) is formed on the surface of the contact layer 65 at the light modulator region, producing a laser array with light modulator comprising a plurality of laser elements with respective light modulators as shown in FIG. 37(g).

In this eighteenth embodiment, since the thicknesses of the well layers and barrier layers of the active layer 62a of each semiconductor laser element with a light modulator vary with the widths of the apertures, the wavelengths of the light emitted from the respective laser elements are different. As a result, an array laser provided with light modulators that can emit laser light of different wavelengths is produced.

As described above, in the laser array with light modulators according to this eighteenth embodiment, the thermal etching as a mask with a plurality of apertures having different widths, and a double heterojunction structure is regrown to form a laser array comprising a plurality of laser elements with light modulators. The plurality of laser elements have quantum well active layers with thicknesses that are different, depending on the widths of the apertures of the insulating film, thereby shortening the fabricating process of a laser array with light modulators that can emit a plurality of different wavelengths.

In the sixteenth to eighteenth embodiments, a description is given of semiconductor lasers, but the present invention can be also applied to semiconductor devices other than semiconductor lasers with the same effects.

Embodiment 19

Figure 38:
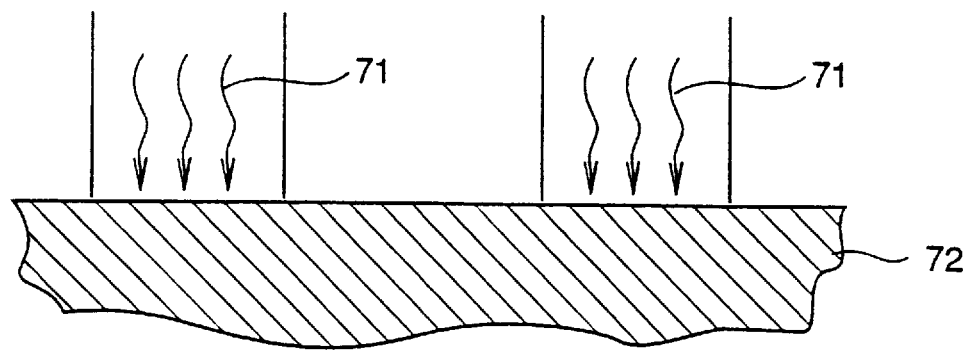
FIGS. 38(a)–38(c) are diagrams for explaining an etching method for semiconductor according to the nineteenth embodiment of the present invention.
Figure 38:
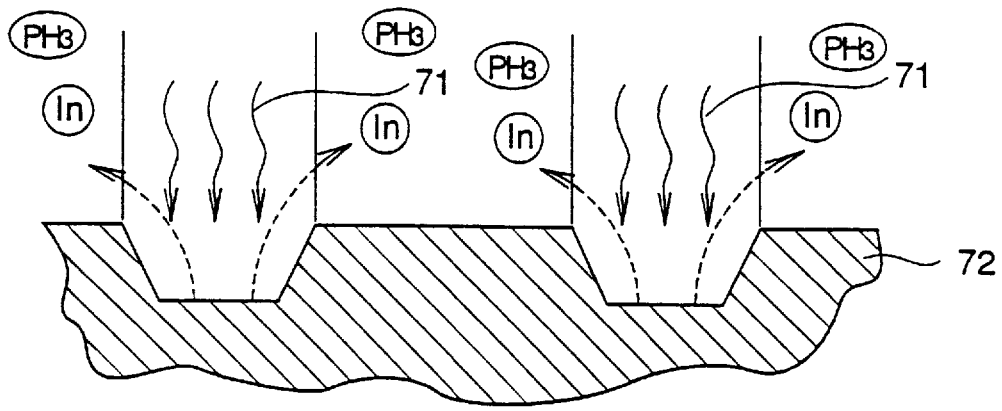
Figure 38:
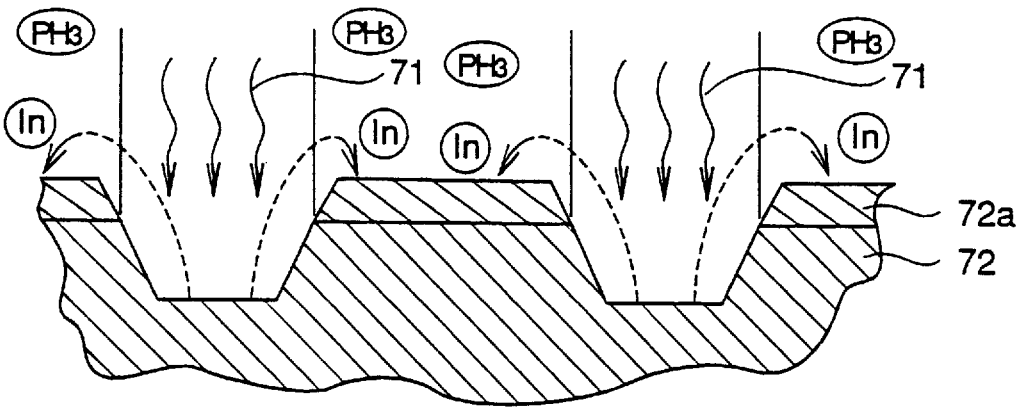

FIGS. 38(*a*)–38(*c*) are diagrams illustrating a semiconductor etching method according to a nineteenth embodiment of the present invention. In the figures, reference numeral 71 designates visible light, numeral 72 designates an InP substrate, and numeral 72*a* designates an InP regrowth layer.

A description is given of a semiconductor etching method. First of all, the InP substrate 72 is kept in an ambient at a temperature lower than the temperature at which only InP is etched under the same conditions as described for the first embodiment. Next, as shown in FIG. 38(*a*), visible light irradiates only the region on the substrate 72 which is to be etched. Then, the portion which is irradiated reaches the temperature at which the thermal etching is possible and only the InP that is irradiated is heated and is selectively etched (FIG. 38(*b*)).

As described above, in this nineteenth embodiment, the thermal etching described as the first embodiment and light irradiation are combined, and only the region on the surface of the InP layer surface irradiated by light is heated, and the heated region is etched, whereby the InP layer can be easily selectively etched without using a selective mask such as an insulating film.

In the nineteenth embodiment, visible light is used but infrared light or ultraviolet light may be employed with the same effects as in the nineteenth embodiment.

In the nineteenth embodiment, when the temperature of the substrate 1 is lower than the temperature at which InP is etched and at which InP may be grown, and the energy is increased by light irradiation, InP is etched and the etched In diffuses into the vapor phase as shown in FIG. 38(*c*). Since the In atoms diffuse to areas not irradiated by light and react with $PH_3$ in the etching ambient, the InP layer 72*a* is regrown, whereby selective etching and the selective growth can be performed at the same time.

In the nineteenth embodiment, the thermal etching described as the first embodiment is used. The present invention can be applied to vapor phase etching using a halogen gas and, even in this case, with light irradiation, the portion that receives the energy of the light is likely to react with the halogen gas, such as Hcl, whereby selective etching of the region irradiated with light is possible.

Embodiment 20

Figure 39:
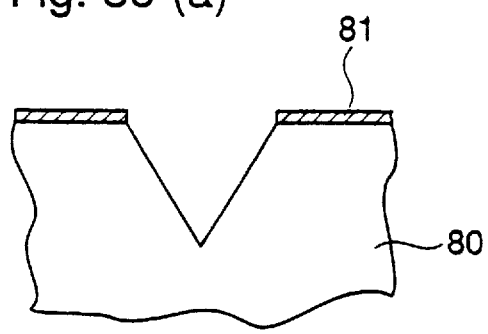
FIGS. 39(a)–39(d) are diagrams for explaining a method of fabricating a quantum wire structure according to a twentieth embodiment of the present invention.
Figure 39:
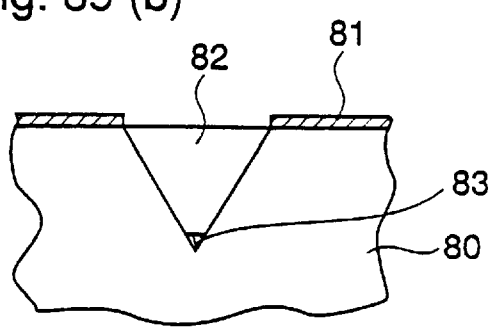
Figure 39:
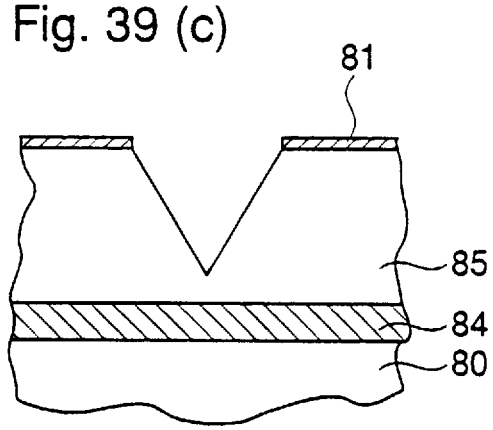
Figure 39:
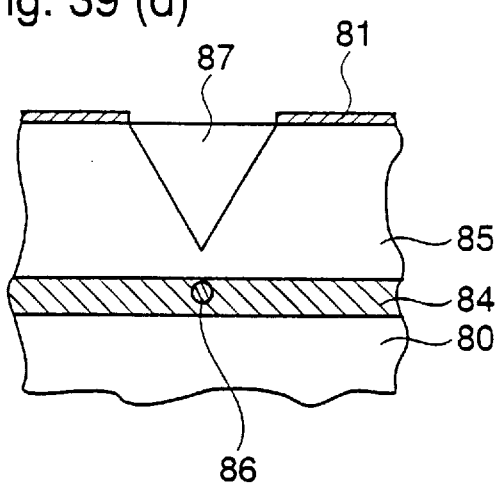

FIGS. 39(*a*)–39(*d*) are cross-sectional views illustrating main process steps of a method of fabricating a quantum wire structure using the thermal etching described as the first embodiment. In the figures, numeral 80 designates an InP substrate, numeral 81 designates an insulating film pattern, numeral 82 designates an InP burying layer, numeral 87 designates an n type InP burying layer, numeral 83 designates an InGaAs electron channel layer, numeral 84 designates an i type InGaAs electron channel layer, and numeral 85 designates an electron storage part.

A description is given of the fabricating method. An insulating film 81 is formed on the (100) just surface of the InP substrate 80, and a stripe-shaped aperture extending in the [0$\overline{1}\overline{1}$] direction is formed in the insulating film 81 by photolithography. Thereafter, a V-shaped groove having side surfaces in (111) planes is formed using the thermal etching described as the first embodiment.

Next, an InGaAs electron supplying layer 83 is grown to a thickness less than 10 nm at the bottom of the V-shaped groove. Since the side surfaces of the V-shaped groove are (111) planes, the InGaAs layer 83 hardly grows there. Further, the InP burying layer 82 is grown on the InGaAs layer 83. By this process, a quantum wire structure comprising the InGaAs layer 83 surrounded by the InP substrate 80 and the InP burying layer 82 are formed.

In this twentieth embodiment, since the V-shaped groove is formed by the thermal etching of the first embodiment, a quantum wire can be formed with high controllability.

While in the twentieth embodiment, InGaAs is used as a material where a quantum well is formed, the present invention can employ any material that can be employed for a quantum wire, such as AlInAs.

In the twentieth embodiment a quantum wire is formed is described. However, it is possible to integrate a plurality of quantum wires on a substrate. An alternative of the twentieth embodiment in which a plurality of quantum wires are formed on a substrate will be described.

Figure 40:
FIGS. 40(a)–40(d) are diagrams for explaining a method of fabricating a quantum wire structure according to an alternative of the twentieth embodiment of the present invention.
Figure 40:
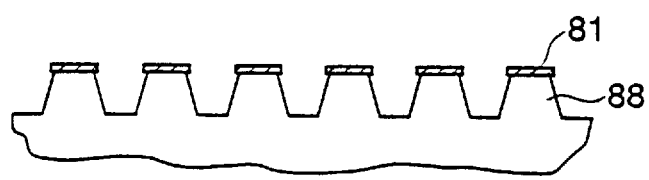
Figure 40:
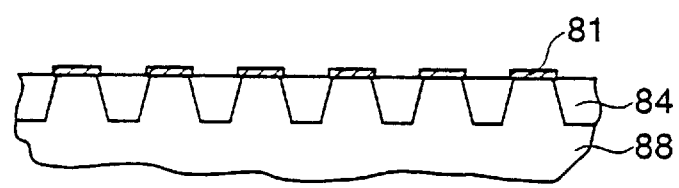
Figure 40:
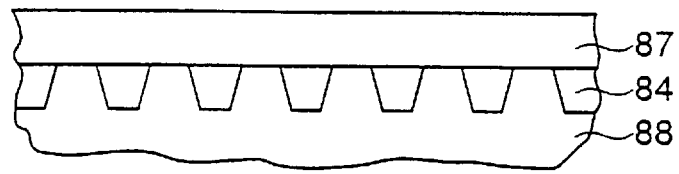

FIG. 40 is a diagram illustrating an alternative of the twentieth embodiment of the present invention. In the figures, reference numeral 39 designates the same or corresponding elements. Numeral 88 designates a p type InP substrate, and numeral 89 designates an n type InP layer.

A description is given of the fabricating method. An insulating film 81 is formed on the (100) surface of the p type InP layer, and a minute pattern in which a plurality of apertures having a width of about 20 nm, are arranged with an interval of 20 nm is formed using an EB (electron beam), an FIB (focused ion beam), interference exposure, or phase shifting exposure. By the thermal etching using the insulating film 81 as a mask, grooves having (111) surfaces as side surfaces are formed. The i type InGaAs electron channel layer 84 is selectively grown to fill the groove and after the removal of the mask 81, the n type InP layer 87 forms a quantum wire comprising the InGaAs layer 84.

Figure 41:
FIGS. 41(a)–41(d) are diagrams for explaining a method of fabricating a quantum wire structure according to another alternative of the twentieth embodiment of the present invention.
Figure 41:
Figure 41:
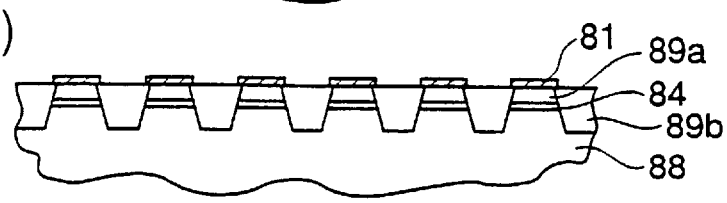
Figure 41:
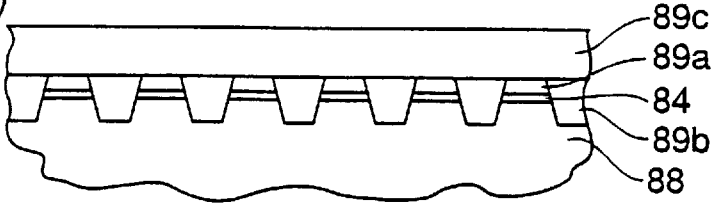
Figure 42:
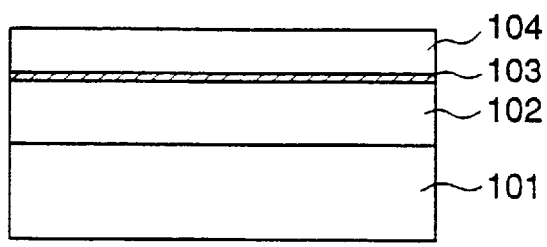
FIGS. 42(a)–42(d) are diagrams for explaining a semiconductor etching method according to the prior art.
Figure 42:
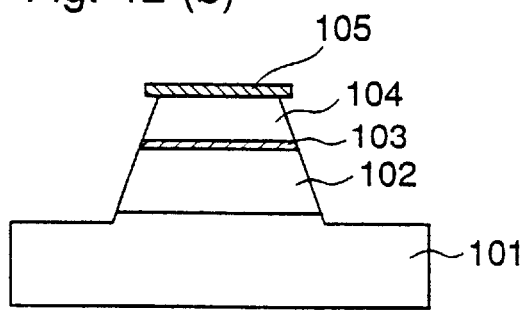
Figure 42:
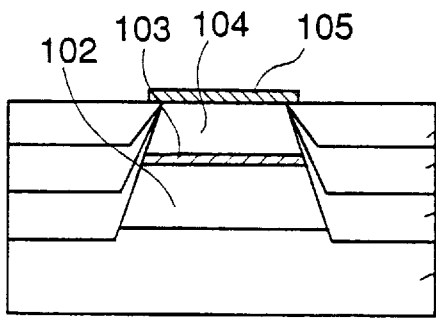
Figure 42:
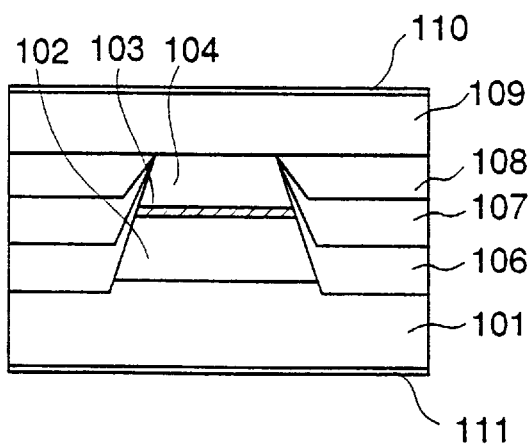

In the alternative of this twentieth embodiment, the same effects as in the twentieth embodiment are obtained and the quantum wire can be easily integrated. In this alternative, after the substrate 88 is thermally etched, the i type InGaAs layer 84 as the quantum wire is formed. However, as shown in FIG. 41(*a*), the i type InGaAs layer 84 and the first n type InP layer 89*a* may be formed on the substrate 11. An insulating film 81 having a fine pattern of apertures with a width of about 20 nm, is formed, the thermal etching is performed until reaching the substrate 88, the etching groove is filled with the second n type InP layer 89*b* and, after the removal of the insulating film 81, the third n type InP layer 89*c* may be formed on the surface of the first n type InP layer 89*a* and the surface of the second n type InP layer 89*c*. In FIGS. 41(*a*)–41(*d*), the reference numerals the same as in the FIGS. 40(a)–40(d) designate the same or corresponding elements. Numerals 89a, 89b and 89c designate first, second, and third n type InP layers. The same effects as in the twentieth embodiment are obtained.

In semiconductor devices such as semiconductor laser devices as illustrated in the first to twelfth embodiments, the fourteenth embodiment, and the sixteenth to eighteenth embodiments, InP is used for the contact layer. In order to make an easy contact with the electrode, an InGaAs contact layer may be laminated on the InP contact layer.

Further, in this embodiment, the thermal etching method is applied to an InP series material. The present invention can be applied to other III-V compound semiconductor materials. For example, when the thermal etching is performed to GaAs, $AsH_3$ is supplied in place of $PH_3$ to etch at a higher temperature than the growth temperature of GaAs, and when a III-V compound semiconductor other than GaAs is etched, the etching may be performed at a higher temperature than the growth temperature of the III-V compound semiconductor. In such a case, the same effects as in the respective embodiments are obtained.

What is claimed is:

1. A method of etching a semiconductor comprising etching a III-V compound semiconductor layer using an etching gas including the Group V element of said III-V compound semiconductor layer and excluding etching gases including halogens while keeping said III-V compound semiconductor layer at a temperature higher than a crystal growth temperature of said III-V compound semiconductor layer.

2. The method of claim 1, including adding a gas including the group III element of said III-V compound semiconductor layer to the etching gas to control the etching.

3. The method of claim 1, wherein said III-V compound semiconductor layer is InP and the etching gas includes phosphorus.

4. The method of claim 1, wherein said III-V compound semiconductor layer is InP, including etching said InP layer at a temperature above 700° C.

5. The method of claim 1, wherein said III-V compound semiconductor layer is InP, including keeping said InP layer at a temperature above 700° C., using $PH_3$ gas at a flow rate of 400 SCCM and $H_2$ at a flow rate of 25 SCCM as etching gases, and keeping the pressure at 30 Torr.

6. The method of claim 1, further comprising:
    forming an insulating film with a plurality of stripe-shaped apertures in a plurality of respective regions, each region having apertures of different widths on a surface of said III-V compound semiconductor layer; and
    selectively etching said III-V compound semiconductor layer using said insulating film as a mask.

7. The method of claim 1, further comprising:
    forming an insulating film with a plurality of stripe-shaped apertures with widths, said film having a plurality of respective regions, each region having apertures of respective, different widths; and
    selectively etching said III-V compound semiconductor layer using said insulating film as a mask.

8. A method of etching a semiconductor comprising selectively etching only a region of a surface of a III-V compound semiconductor layer while said III-V compound semiconductor layer is in an ambient of an etching gas including the Group V element of said III-V compound semiconductor layer and excluding etching gases including halogens, and heating said region to a temperature higher than a crystalline growth temperature of said III-V compound semiconductor layer.

9. The method of claim 8, including holding said III-V compound semiconductor layer, during the etching, at a temperature at which crystal growth of said III-V compound semiconductor layer is possible.

10. A method of fabricating a semiconductor device comprising:
    forming an insulating film having an aperture on a surface of a III-V compound semiconductor layer;
    selectively etching said III-V compound semiconductor layer using said insulating film as a mask using an etching gas including the Group V element of said III-V compound semiconductor layer and excluding etching gases including halogens, while said III-V compound semiconductor layer is maintained at a temperature higher than a crystal growth temperature of said III-V compound semiconductor layer; and
    growing another semiconductor layer, using said insulating film as a mask, on said III-V compound semiconductor layer, after replacing the etching gas with a crystal growth gas without said III-V compound semiconductor layer being exposed to air.

11. A method of fabricating a semiconductor device comprising:
    forming an insulating film having an aperture on a surface of a first conductivity type III-V compound semiconductor layer;
    selectively etching said first conductivity type III-V compound semiconductor layer, using said insulating film as a mask, with an etching gas including the Group V element of said III-V compound semiconductor layer and excluding etching gases including halogens, while maintaining said III-V compound semiconductor layer at a temperature higher than a crystalline growth temperature of said III-V compound semiconductor layer; and
    selectively growing a double heterojunction structure comprising a first conductivity type cladding layer, an active layer, and a second conductivity type cladding layer successively, using said insulating film as a mask, after replacing the etching gas with a crystalline growth gas without said III-V compound semiconductor layer being exposed to air.

12. A method of fabricating a semiconductor device comprising:
    forming an insulating film having an aperture on a surface of a III-V compound semiconductor layer;
    selectively etching said III-V compound semiconductor layers, using said insulating film as a mask, with an etching gas including the Group V element of said III-V compound semiconductor layer and excluding etching gases including halogens, while maintaining said III-V compound semiconductor layer at a temperature higher than a crystalline growth temperature of said III-V compound semiconductor layer; and
    selectively growing a multi-quantum well structure layer, using said insulating film as a mask, after replacing the etching gas with a crystalline growth gas without said III-V compound semiconductor layer being exposed to air.

13. A method of fabricating a semiconductor device comprising:
    forming an insulating film having a plurality of stripe-shaped apertures arranged in parallel with each other on a III-V compound semiconductor layer; and
    selectively etching said III-V compound semiconductor layer, using said insulating film as a mask, with an etching gas including the Group V element of said III-V compound semiconductor layer and excluding etching gases including halogens, while maintaining said III-V compound semiconductor layer at a temperature higher than a crystalline growth temperature of said III-V compound semiconductor layer.

14. The method of fabricating a semiconductor device of claim 13, wherein said insulating film includes a first region in which the stripe-shaped apertures have a first stripe length and a second region including stripe-shaped apertures having different lengths from the first stripe length.

15. The method of fabricating a semiconductor device of claim 13, wherein said plurality of stripes-shaped apertures have a uniform stripe length, and said insulating film has a width in a direction perpendicular to the apertures in a first region that is narrower than the width of said insulating film in a second region.

16. The method of fabricating a semiconductor device of claim 13, comprising after selectively etching said III-V compound semiconductor layer, growing another semiconductor layer using said insulating film as a mask, after replacing the etching gas with a crystal growth gas without said III-V compound semiconductor layer being exposed to air.

17. A method of fabricating a semiconductor layer comprising:
forming a current blocking layer comprising a III-V compound semiconductor on a surface of a first conductivity type III-V compound semiconductor substrate;
forming an insulating film having a stripe-shaped aperture on a surface of said current blocking layer;
forming a stripe-shaped groove by selectively etching said current blocking layer, using said insulating film as a mask, with an etching gas including the Group V element of said III-V compound semiconductor layer and excluding etching gases including halogens, while maintaining said III-V compound semiconductor layer at a temperature higher than a crystalline growth temperature of said III-V compound semiconductor to form a stripe-shaped groove; and
selectively growing a double heterojunction structure comprising a first conductivity type cladding layer, an active layer, and a second conductivity type cladding layer, using said insulating film as a mask, after replacing the etching gas with a crystalline growth gas without the surface of the stripe-shaped groove being exposed to air.

18. A method of fabricating a semiconductor laser comprising:
forming a III-V compound semiconductor double heterojunction structure comprising a first conductivity type cladding layer, an active layer, and a second conductivity type cladding layer on a surface of a first conductivity type III-V semiconductor substrate;
forming a stripe-shaped insulating film double heterojunction structure and forming a mesa stripe by selectively etching said double heterojunction structure to reach said substrate, using said insulating film as a mask and using an etching gas including the Group V element of said III-V compound semiconductor double heterojunction structure and excluding etching gases including halogens, while keeping said III-V compound semiconductor of said double heterojunction structure at a temperature higher than a crystal growth temperature of said III-V compound semiconductor of said double heterojunction structure to form a mesa stripe; and
selectively growing a current blocking layer to bury said mesa stripe, using said insulating film as a mask, after replacing the etching gas with a crystal growth gas without the surface of said stripe-shaped groove being exposed to air.

19. A method of fabricating a semiconductor laser comprising:
forming a current blocking layer comprising a III-V compound semiconductor on a surface of a first conductivity type III-V compound semiconductor substrate;
forming an insulating film having a plurality of stripe-shaped parallel apertures and having different aperture widths on the surface of the current blocking layer;
forming stripe-shaped grooves by selectively etching said current blocking layer to reach said substrate, using said insulating film as a mask, with an etching gas including the Group V element of said III-V compound semiconductor current blocking layer and excluding etching gases including halogens, while maintaining said III-V compound semiconductor current blocking layer at a temperature higher than a crystalline growth temperature of said III-V compound semiconductor, to form a plurality of stripe-shaped grooves; and
selectively growing a double heterojunction structure comprising a first conductivity type cladding layer, a multi-quantum well structure active layer, and a second conductivity type cladding layer, using said insulating film as a mask, after replacing the etching gas with a crystalline growth gas without the surface of the stripe-shaped grooves being exposed to air.

20. A method of fabricating a semiconductor laser device comprising:
forming a first insulating film having a plurality of stripe-shaped parallel apertures and having different aperture widths on a surface of a first conductivity type III-V compound semiconductor substrate;
selectively etching said III-V compound semiconductor substrate, using said first insulating film as a mask, with an etching gas including the Group V element of said III-V compound semiconductor substrate and excluding etching gases including halogens, while maintaining said III-V compound semiconductor substrate at a temperature higher than a crystalline growth temperature of said III-V compound semiconductor substrate, to form a plurality of stripe-shaped grooves;
selectively growing a double heterojunction structure comprising a first conductivity type cladding layer, a multi-quantum well structure active layer, and a second conductivity type cladding layer, using said first insulating film as a mask, after replacing the etching gas with a crystalline growth gas without the surface of the stripe-shaped grooves being exposed to air, to fill the stripe-shaped grooves;
after removing said first insulating film, forming a stripe-shaped second insulating film extending in a length direction of said double heterojunction structure on said double heterojunction structure and etching said double heterojunction structure using said second insulating film as a mask, thereby forming a mesa-stripe; and
forming a current blocking layer burying said mesa-stripe using said second insulating film as a mask.

21. A method of fabricating a semiconductor laser comprising:
forming an insulating film having a stripe-shaped aperture on a surface of a first semiconductor layer comprising a III-V compound semiconductor;

selectively etching said III-V compound semiconductor substrate, using said stripe-shaped insulating film as a mask, with an etching gas including the Group V element of said III-V compound semiconductor layer and excluding etching gases including halogens, while maintaining said III-V compound semiconductor layer at a temperature higher than a crystalline growth temperature of said III-V compound semiconductor, to form a plurality of stripe-shaped grooves;

selectively growing an electron channel layer at the bottom of said stripe-shaped grooves using said insulating film as a growth mask after replacing the etching gas with a crystalline growth gas without the stripe-shaped grooves being exposed to air; and selectively growing a second III-V compound semiconductor layer comprising the same material as said first semiconductor layer, filling the stripe-shaped grooves using said insulating film as a growth mask.

22. A method of fabricating a semiconductor device comprising:

forming an electron channel layer comprising an intrinsic semiconductor layer and a second semiconductor layer comprising an intrinsic III-V compound semiconductor layer electron channel layer on a surface of a first semiconductor layer;

forming an insulating film having a stripe-shaped aperture on a surface of said second semiconductor layer;

etching said second semiconductor layer, using said insulating film as a mask, with an etching gas including the Group V element of said III-V compound semiconductor layer and excluding etching gases including halogens, while maintaining said III-V compound semiconductor layer at a temperature higher than a crystal growth temperature of said III-V compound semiconductor, to a depth not reaching said electron channel layer, to form a stripe-shaped V-shaped groove; and selectively growing a third III-V compound semiconductor layer having a prescribed conductivity type and comprising the same material as said first semiconductor layer to fill the V-shaped groove using said insulating film as a mask, after replacing the etching gas with a crystalline growth gas without the surface of said second semiconductor layer being exposed to air.

* * * * *